United States Patent
Kim et al.

(10) Patent No.: US 9,660,200 B2
(45) Date of Patent: May 23, 2017

(54) ORGANIC LIGHT-EMITTING DEVICE

(71) Applicants: SAMSUNG DISPLAY CO., LTD., Yongin-si, Gyeonggi-do (KR); DUK SAN NEOLUX CO., LTD., Cheonan-si, Chungcheongnam-do (KR)

(72) Inventors: Mi-Kyung Kim, Yongin-si (KR); Chang-Woong Chu, Yongin-si (KR); Kwan-Hee Lee, Yongin-si (KR); Se-Hun Kim, Yongin-si (KR); Hwan-Hee Cho, Yongin-si (KR); Dae-Yup Shin, Yongin-si (KR); Jung-Hwan Park, Ulsan (KR); Bum-Sung Lee, Ulsan (KR)

(73) Assignees: SAMSUNG DISPLAY CO., LTD., Yongin-si, Gyeonggi-do (KR); DUK SAN NEOLUX CO., LTD., Cheonan-si, Chungcheongnam-do (KR)

( * ) Notice: Subject to any disclaimer, the term of this patent is extended or adjusted under 35 U.S.C. 154(b) by 0 days.

(21) Appl. No.: 15/287,192

(22) Filed: Oct. 6, 2016

(65) Prior Publication Data
US 2017/0025619 A1    Jan. 26, 2017

Related U.S. Application Data

(63) Continuation-in-part of application No. 14/319,351, filed on Jun. 30, 2014, now Pat. No. 9,466,808.

(30) Foreign Application Priority Data

Jul. 1, 2013 (KR) .................. 10-2013-0076602

(51) Int. Cl.
*H01L 29/08* (2006.01)
*H01L 35/24* (2006.01)
*H01L 51/00* (2006.01)
(Continued)

(52) U.S. Cl.
CPC ........ *H01L 51/0071* (2013.01); *C09K 11/025* (2013.01); *C09K 11/06* (2013.01);
(Continued)

(58) Field of Classification Search
USPC .......................................... 257/40
See application file for complete search history.

(56) References Cited

U.S. PATENT DOCUMENTS

2009/0189519 A1    7/2009   Lee et al.
2013/0146850 A1    6/2013   Pieh et al.
(Continued)

FOREIGN PATENT DOCUMENTS

| KR | 10-2011-0066766 A | 6/2011 |
|---|---|---|
| KR | 10-2012-0038374   | 4/2012 |
| KR | 10-2012-0136618   | 12/2012 |

*Primary Examiner* — Telly Green
(74) *Attorney, Agent, or Firm* — Lee & Morse, P.C.

(57) ABSTRACT

An organic light-emitting device includes a first electrode, a second electrode disposed opposite to the first electrode, and an organic layer disposed between the first electrode and the second electrode and including an emission layer. The emission layer includes at least one first light-emitting material represented by Formula 1 and at least one second light-emitting material represented by Formula 2:

<Formula 1>

(Continued)

-continued

<Formula 2> and $X_1$ to $X_{12}$, $Ar_1$, M, $X_{21}$ to $X_{24}$, A, B, $R_1$ to $R_{12}$, $R_{21}$, $R_{22}$, $a_1$, $a_2$, n, L, M in Formulae 1 and 2 are defined as in the specification.

13 Claims, 2 Drawing Sheets

(51) Int. Cl.
C09K 11/06 (2006.01)
C09K 11/02 (2006.01)
H01L 51/50 (2006.01)

(52) U.S. Cl.
CPC ...... H01L 51/0072 (2013.01); H01L 51/0085 (2013.01); *C09K 2211/1007* (2013.01); *C09K 2211/1029* (2013.01); *C09K 2211/185* (2013.01); *H01L 51/5016* (2013.01); *H01L 51/5056* (2013.01)

(56) References Cited

U.S. PATENT DOCUMENTS

2013/0153867 A1 6/2013 Seo et al.
2014/0319472 A1 10/2014 Cho et al.

ORGANIC LIGHT-EMITTING DEVICE

CROSS-REFERENCE TO RELATED APPLICATIONS

This is a continuation-in-part of pending application Ser. No. 14/319,351, filed Jun. 30, 2014, the entire contents of which is hereby incorporated by reference.

The present application claims priority under 35 U.S.C. §119 to Korean Patent Application No. 10-2013-0076602, filed on Jul. 1, 2013, in the Korean Intellectual Property Office, and entitled: "Organic Light-Emitting Device," which is incorporated by reference herein in its entirety.

BACKGROUND

1. Field

One or more embodiments relate to an organic light-emitting device.

2. Description of the Related Art

Organic light-emitting devices (OLEDs), which are self-emitting devices, have advantages such as wide viewing angles, excellent contrast, quick response, high brightness, excellent driving voltage characteristics, and can provide multicolored images. A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the structure described herein is as follows. When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

Embodiments are directed to an organic light-emitting device, including a first electrode; a second electrode disposed opposite to the first electrode; and an organic layer disposed between the first electrode and the second electrode, wherein, the organic layer includes an emission layer and a hole transport region, the hole transport region is disposed between the first electrode and the emission layer, the emission layer includes a condensed cyclic compound represented by Formula 101, and the hole transport region includes an amine-based compound represented by Formula 201,

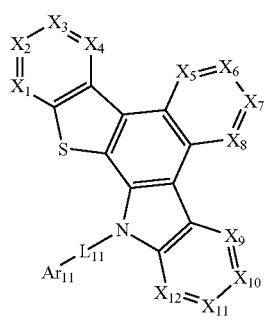
<Formula 101>

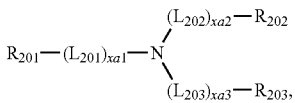
<Formula 201>

In Formulae 101 and 201, $X_1$ may be $CR_1$ or N; $X_2$ is $CR_2$ or N; $X_3$ is $CR_3$ or N; $X_4$ is $CR_4$ or N; $X_5$ is $CR_5$ or N; $X_6$ is $CR_6$ or N; $X_7$ is $CR_7$ or N; $X_8$ is $CR_8$ or N; $X_9$ is $CR_9$ or N; $X_{10}$ is $CR_{10}$ or N; $X_{11}$ is $CR_{11}$ or N; $X_{12}$ is $CR_{12}$ or N, $L_{11}$ may be a group represented by any one of Formulae 301 to 304,

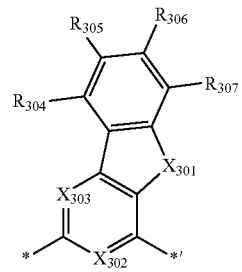
<Formula 301>

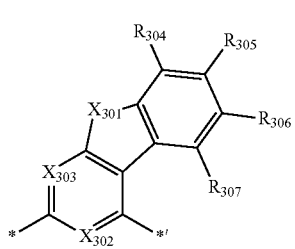
<Formula 302>

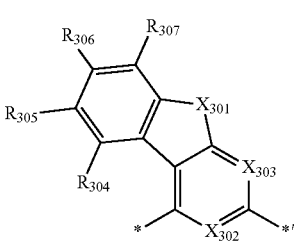
<Formula 303>

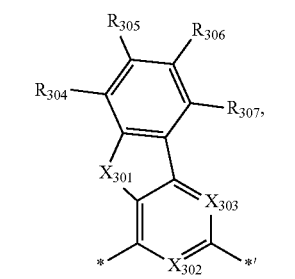
<Formula 304>

In Formulae 301 to 304, $X_{301}$ may be selected from O, S, and Se, $X_{302}$ may be $CR_{302}$ or N, $X_{303}$ is $CR_{303}$ or N, $R_{302}$ to $R_{307}$ and $R_1$ to $R_{12}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group,

* and *' each independently indicate a binding site to a neighboring atom.

$L_{201}$ to $L_{203}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa3 are each independently an integer selected from 0 to 3, and $Ar_{11}$ and $R_{201}$ to $R_{203}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

$X_1$ may be $CR_1$; $X_2$ may be $CR_2$; $X_3$ may be $CR_3$; $X_4$ may be $CR_4$; $X_5$ may be $CR_5$; $X_6$ may be $CR_6$; $X_7$ may be $CR_7$; $X_8$ may be $CR_8$; $X_9$ may be $CR_9$; $X_{10}$ may be $CR_{10}$; $X_{11}$ may be $CR_{11}$; and $X_{12}$ may be $CR_{12}$.

$X_{301}$ may be selected from O and S.

$X_{302}$ may be N, and $X_{303}$ may be N.

$R_{302}$ to $R_{307}$ and $R_1$ to $R_{12}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

$L_{201}$ to $L_{203}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si(Q31)(Q32)(Q33), and —N(Q31)(Q32), wherein Q31 to Q33 are each independently selected from a C1-C10 alkyl group, a C1-C10 alkoxy group, a phenyl group, a biphenyl group, a terphenyl group, and a naphthyl group.

Ar₁₁ and R₂₀₁ to R₂₀₃ may each independently be selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spirobifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group.

The condensed cyclic compound represented by Formula 101 may be a condensed cyclic compound represented by Formula 102:

<Formula 102>

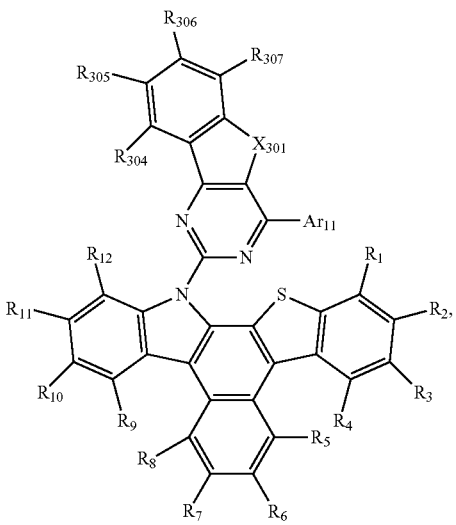

In Formula 102,

Ar₁₁ and R₁ to R₁₂ are the same as described in connection with Formula 1, and

X₃₀₁ and R₃₀₄ to R₃₀₇ are the same as described in connection with Formulae 301 to 304.

The condensed cyclic compound represented by Formula 101 may be Compound 1001:

1001

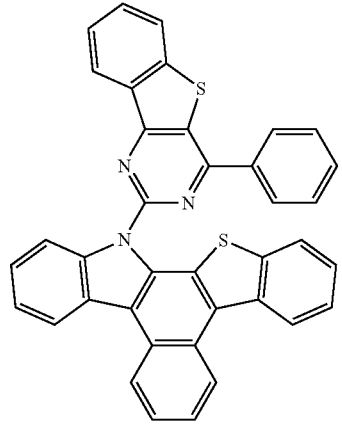

The amine-based compound represented by Formula 201 may be selected from Compounds HT1 to HT15:

HT1

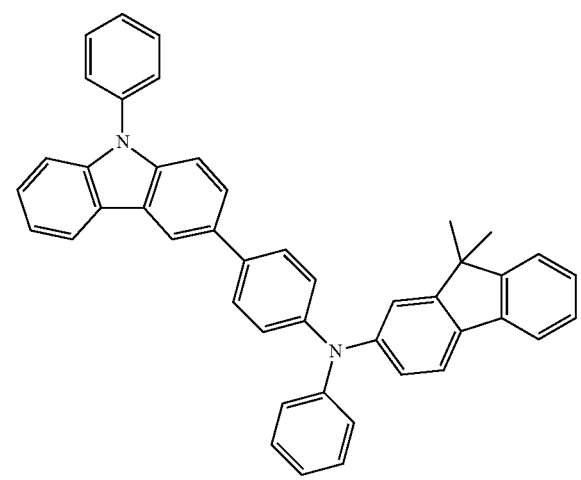

HT2
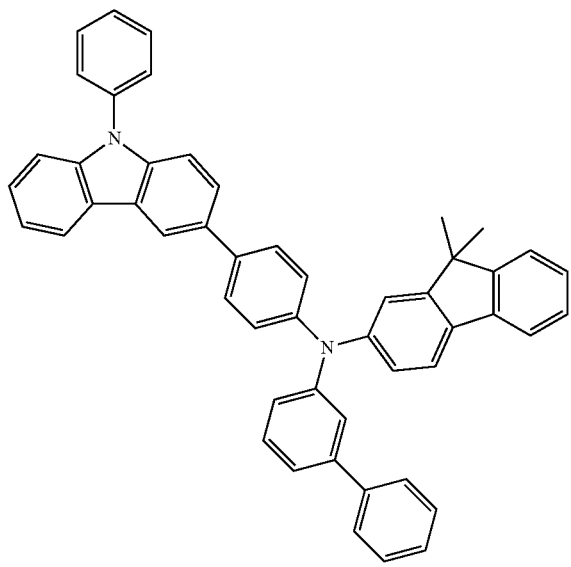
HT4
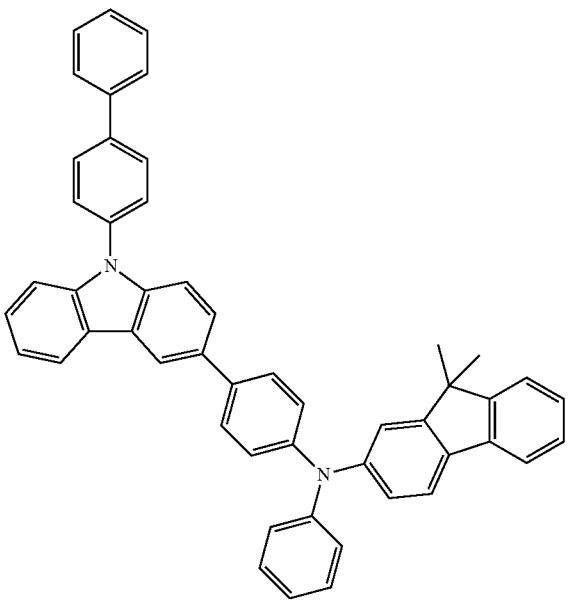
HT3
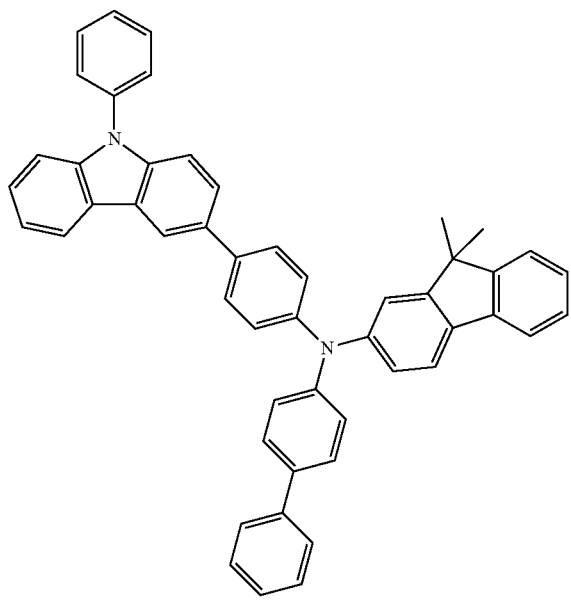
HT5
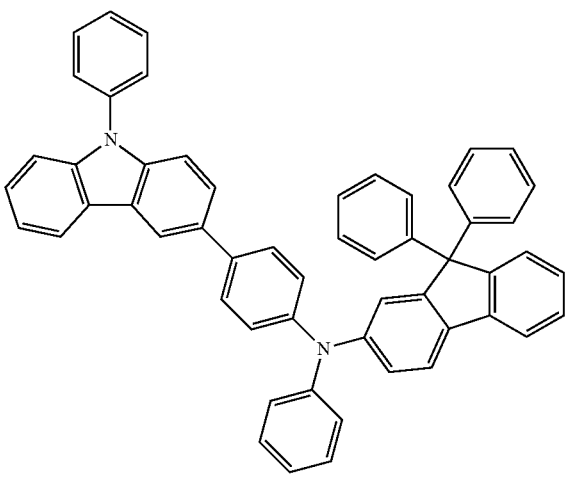

HT6
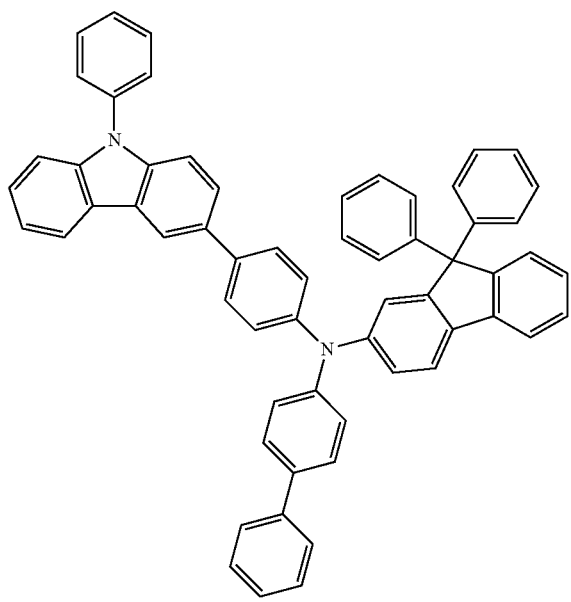
HT8
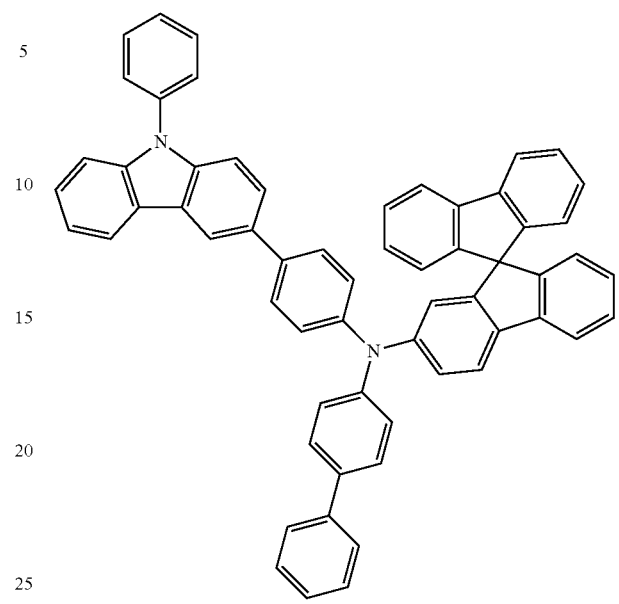
HT7
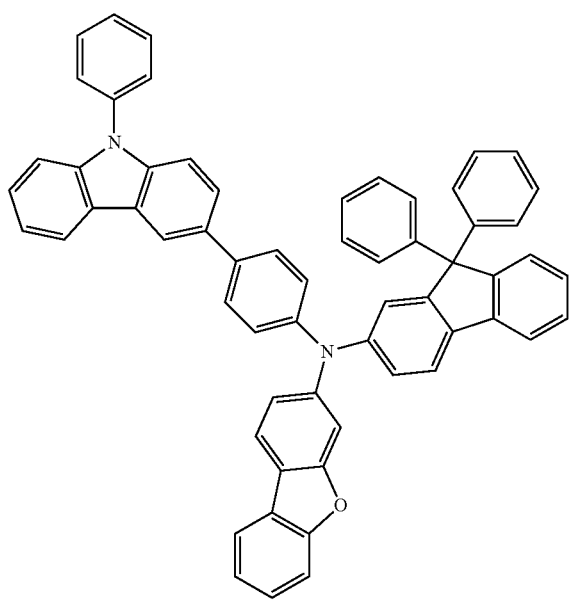
HT9
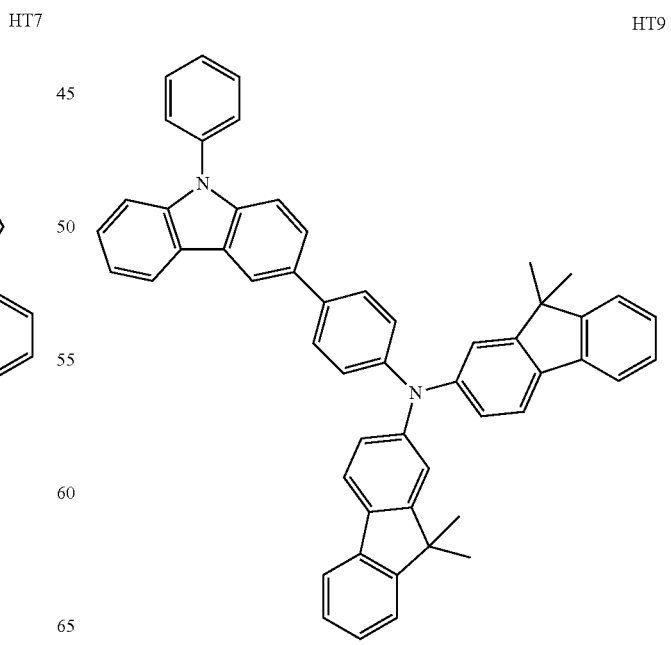

HT10
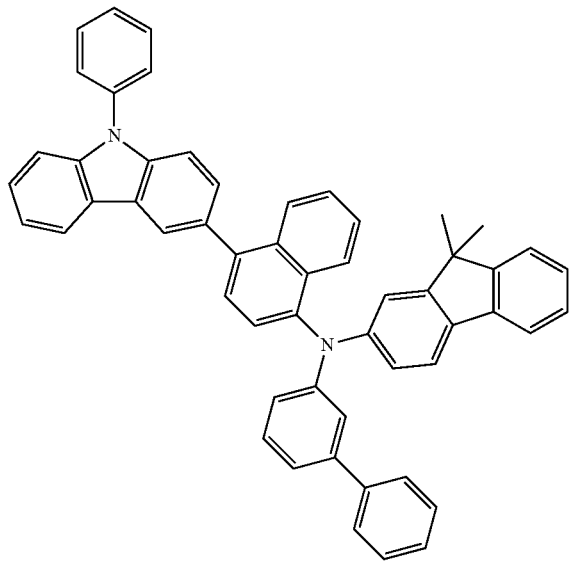
HT11
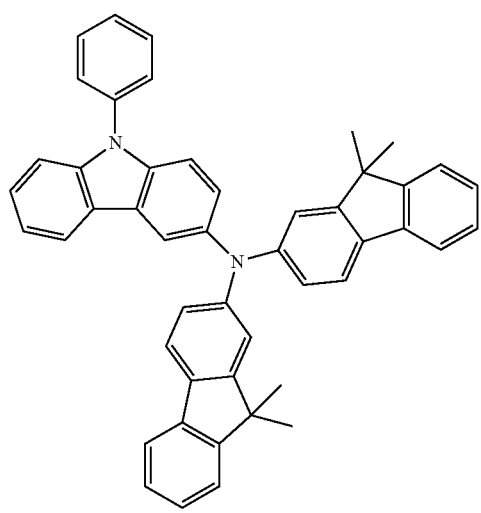
HT12
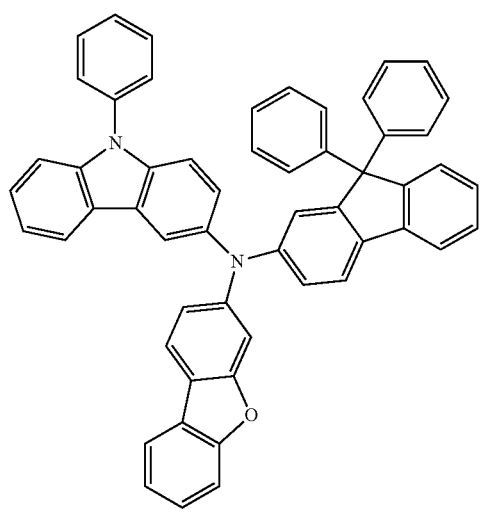
HT13
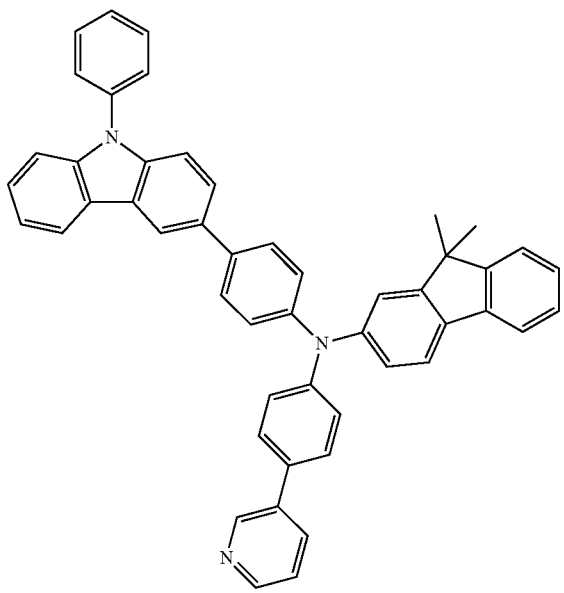
HT14
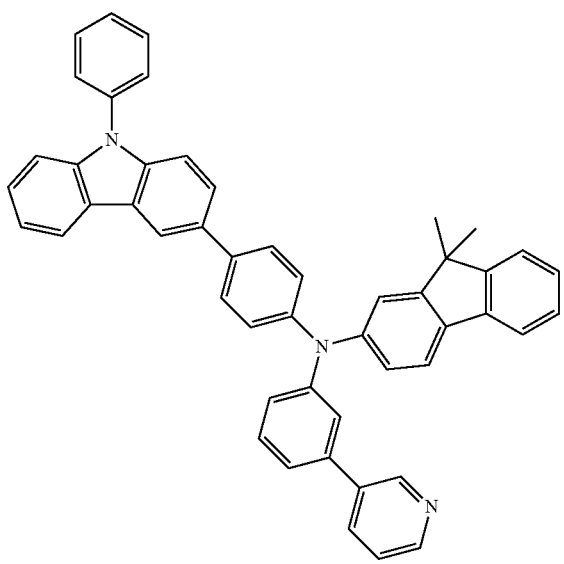

-continued

HT15

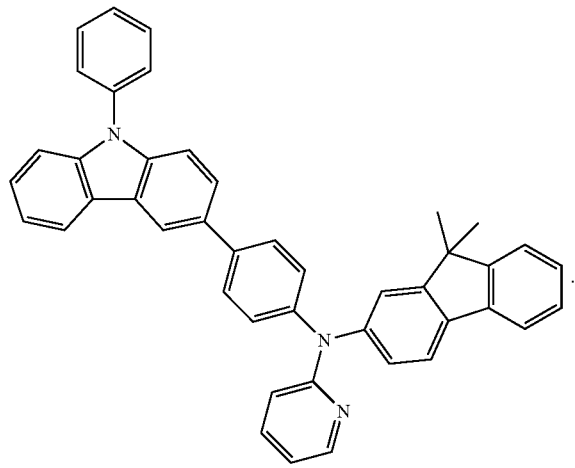

The emission layer may emit red light.

The emission layer may further include an organometallic compound represented by Formula 2:

<Formula 2>

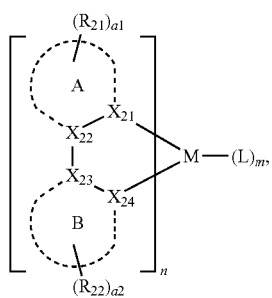

In Formula 2,

M may be a transition metal having an atomic weight of 40 or greater, $X_{21}$ to $X_{24}$ may each independently be a carbon atom or a nitrogen atom, $X_{21}$ and $X_{22}$ may be linked via a single bond or a double bond, $X_{23}$ and $X_{24}$ may be linked via a single bond or a double bond, rings A and B may each independently be selected from a $C_4$-$C_{20}$ cycloalkyl group, a $C_2$-$C_{20}$ heterocycloalkyl group, a $C_6$-$C_{20}$ aryl group, and a $C_2$-$C_{20}$ heteroaryl group, $R_1$ to $R_{12}$, $R_{21}$, and $R_{22}$ may each independently be selected from a hydrogen atom, deuterium atom, —F, —Cl, —Br, —I, a hydroxyl group, a cyano group, a nitro group, an amino group, an amidino group, a hydrazino group, a hydrazono group, —C(=O)$Q_1$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_2$-$C_{60}$ heterocycloalkyl group, a substituted or unsubstituted $C_3$-$C_{60}$ cycloalkenyl group, a substituted or unsubstituted $C_2$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group, a1 and a2 may each independently be an integer from 0 to 8, wherein, when a1 is two or greater, the number a1 of $R_{21}$s may be identical to or different from each other, and when a2 is an integer of 2 or greater, the number a2 of $R_{22}$s may be identical to or different from each other;

n may be an integer from 1 to 3,

L may be selected from a monodentate organic ligand, a bidentate organic ligand, a tridentate organic ligand, and a tetradentate organic ligand, m may be an integer from 0 to 4, and $Q_1$ may be selected from a $C_1$-$C_{10}$ alkyl group, a $C_6$-$C_{10}$ aryl group, and a $C_6$-$C_{60}$ aryloxy group.

The emission layer may further include an organometallic compound selected from Compounds 2-1 to 2-14 and 2-16 to 2-29:

2-1

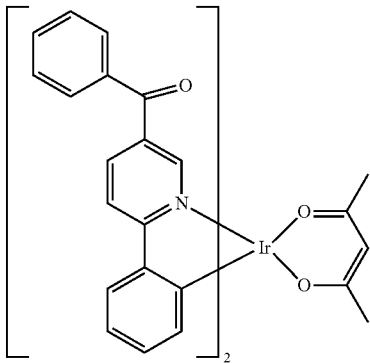

2-2

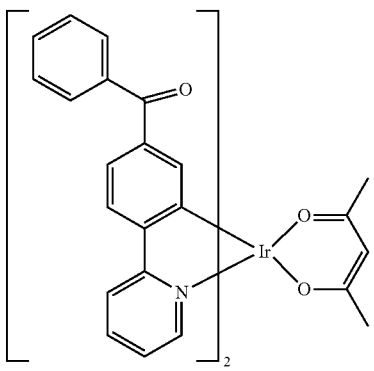

2-3

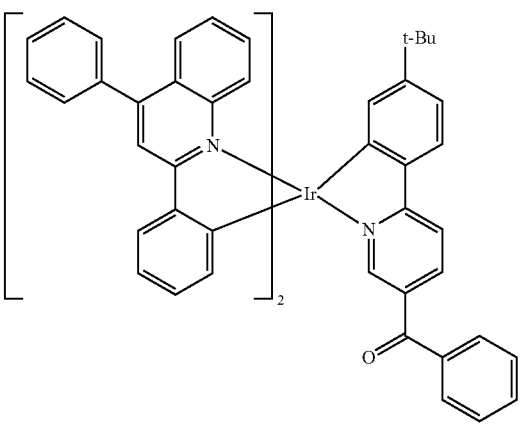

-continued
2-4
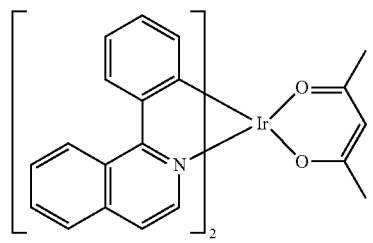
2-5
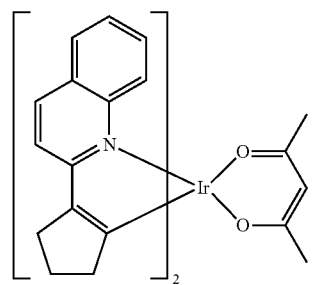
2-6
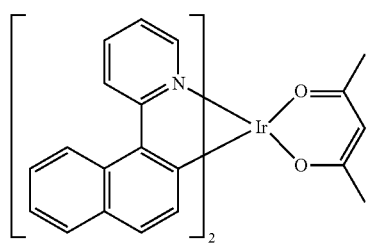
2-7
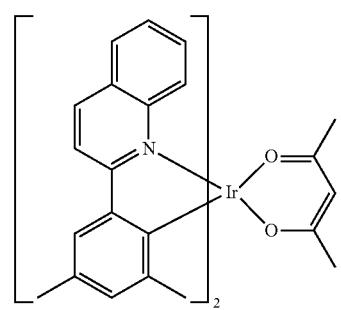
2-8
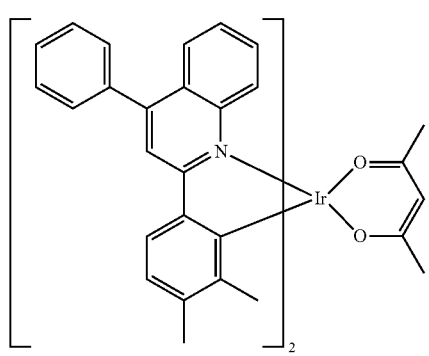
-continued
2-9
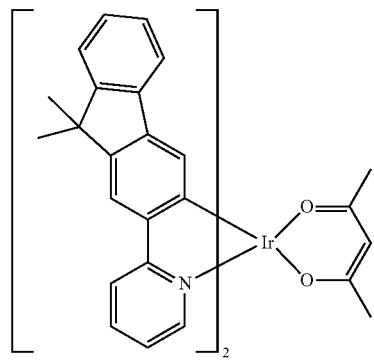
2-10
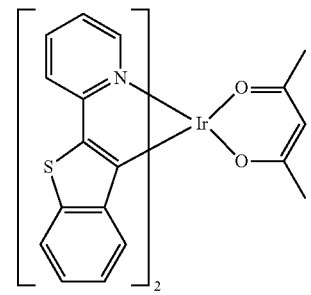
2-11
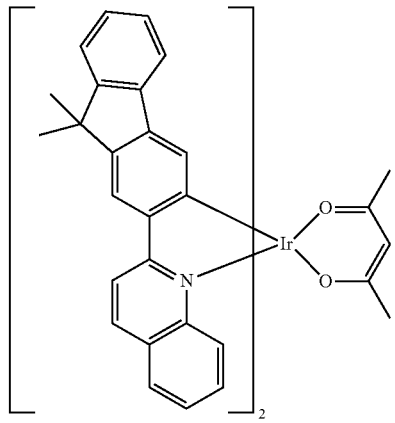
2-12
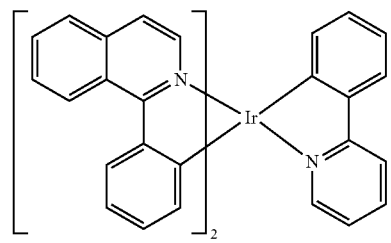
2-13
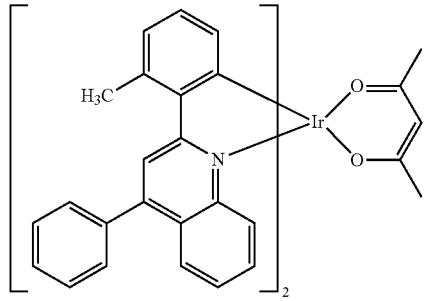

2-14
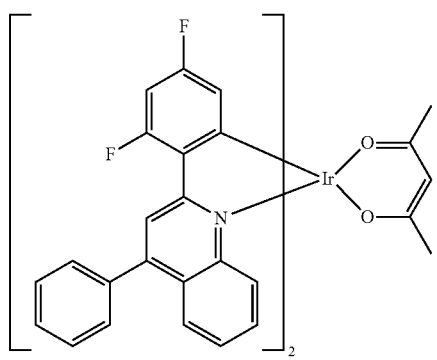
2-16
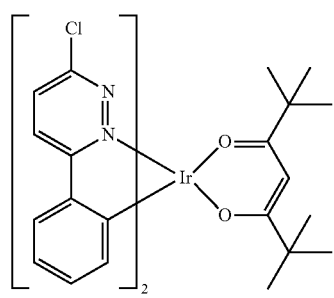
2-17
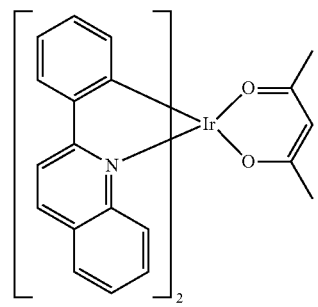
2-18
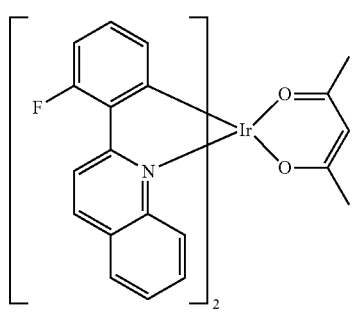
2-19
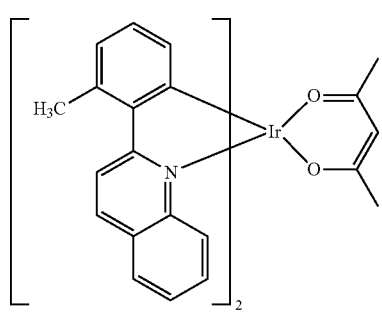
2-20
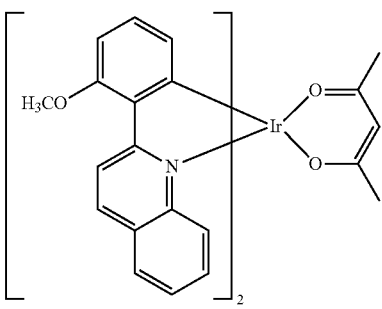
2-21
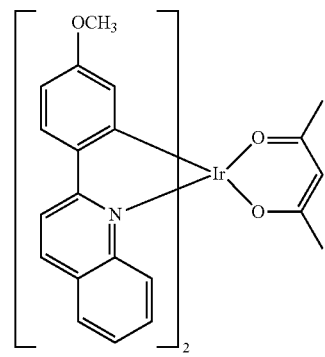
2-22
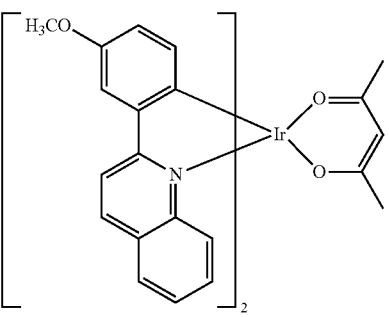
2-23
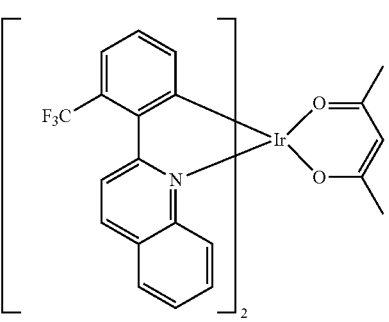
2-24
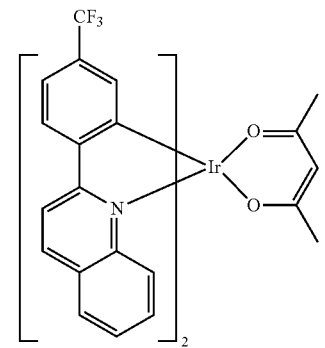

2-25

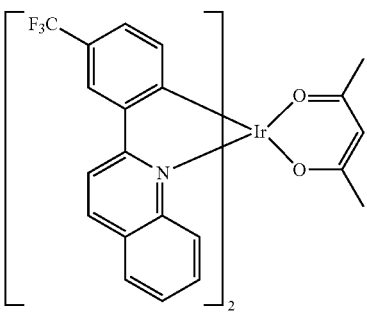

2-26

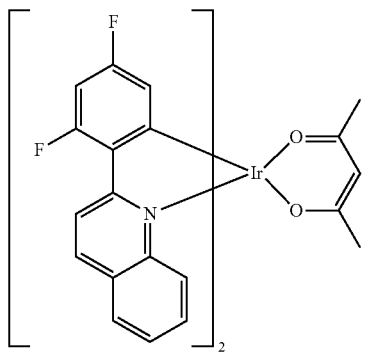

2-27

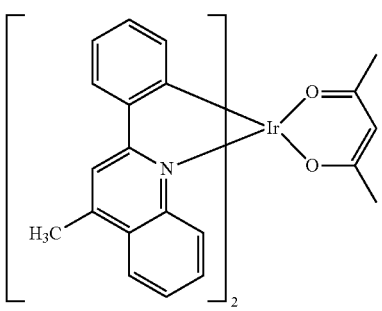

2-28

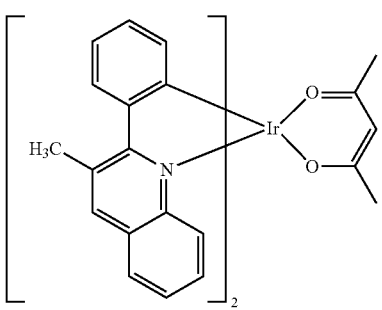

2-29

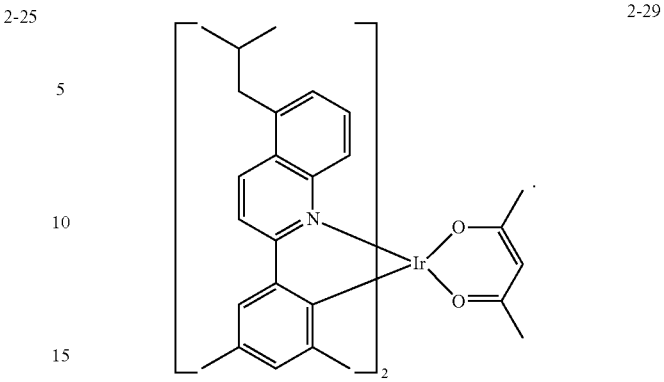

According to one or more embodiments, an organic light-emitting device includes: a first electrode; a second electrode disposed opposite to the first electrode; and an organic layer disposed between the first electrode and the second electrode and including an emission layer, wherein the emission layer includes at least one first light-emitting material represented by Formula 1 and at least one second light-emitting material represented by Formula 2:

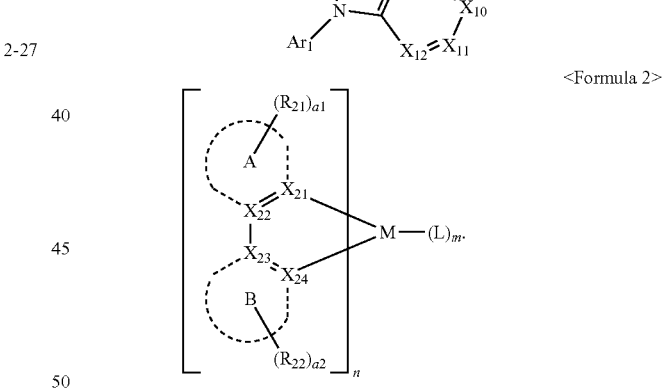

In Formulae 1, $X_1$ is $CR_1$ or N; $X_2$ is $CR_2$ or N; $X_3$ is $CR_3$ or N; $X_4$ is $CR_4$ or N; $X_5$ is $CR_5$ or N; $X_6$ is $CR_6$ or N; $X_7$ is $CR_7$ or N; $X_8$ is $CR_8$ or N; $X_9$ is $CR_9$ or N; $X_{10}$ is $CR_{10}$ or N; $X_{11}$ is $CR_{11}$ or N; $X_{12}$ is $CR_{12}$ or N. $Ar_1$ is selected from i) a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, and ii) a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_2$-$C_{60}$ heterocycloalkyl group, a substituted or unsubstituted $C_3$-$C_{60}$ cycloalkenyl group, a substituted or unsubstituted $C_2$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group; M is a transition metal having an atomic weight of 40 or greater; $X_{21}$ to $X_{24}$ are each independently a carbon atom or a nitrogen atom;

In Formula 2, rings A and B include respective ones of $X_{21}$ to $X_{24}$ and rings A and B are each independently selected from a $C_4$-$C_{20}$ cycloalkyl, a $C_2$-$C_{20}$ heterocycloalkyl, a $C_6$-$C_{20}$ aryl, and a $C_2$-$C_{20}$ heteroaryl; $R_1$ to $R_{12}$, $R_{21}$, and $R_{22}$ are each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, —C(=O)$Q_1$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_2$-$C_{60}$ heterocycloalkyl group, a substituted or unsubstituted $C_3$-$C_{60}$ cycloalkenyl group, a substituted or unsubstituted $C_2$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group, where $Q_1$ is a $C_1$-$C_{10}$ alkyl group, a $C_6$-$C_{10}$ aryl group, or a $C_6$-$C_{60}$ aryloxy group; a1 and a2 are each independently an integer from 0 to 8, when a1 is two or greater, a1 number of $R_{21}$s are identical to or different from each other, and when a2 is an integer of 2 or greater, a2 number of $R_{22}$s are identical to or different from each other; n is an integer from 1 to 3; L is selected from a monodentate organic ligand, a bidentate organic ligand, a tridentate organic ligand, and a tetradentate organic ligand; and m is an integer from 0 to 4.

According to one or more embodiments, an organic light-emitting device includes a substrate, a first electrode, a second electrode disposed opposite to the first electrode, and an organic layer disposed between the first electrode and the second electrode and including an emission layer. The emission layer includes at least one first light-emitting material represented by Formula 1 a and at least one second light-emitting material represented by Formula 2a or 2b:

<Formula 1a>

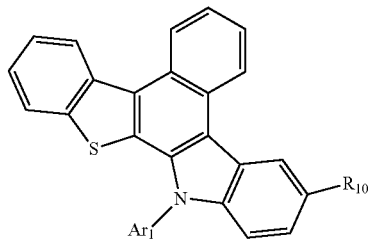

In Formula 1a, $R_{10}$ is selected from i) a hydrogen atom; ii) a phenyl group; iii) a pyrimidyl group and a triazinyl group, each substituted with a phenyl group; and iv) a phenyl group substituted with at least one of a pyrimidyl group and a triazinyl group that are substituted with a phenyl group. $Ar_1$ is selected from i) a phenyl group and a naphthyl group; ii) a phenyl group, a pyridyl group, a quinolinyl group, an isoquinolinyl group, a naphthyridinyl group, and a quinazolinyl group, each substituted with at least one of a phenyl group, a biphenyl group, a pyridnyl group, a quinolinyl group, and isoquinolinyl group; and iii) a phenyl group, a pyridyl group, a quinolinyl group, an isoquinolinyl group, a naphthyridinyl group, and a quinazolinyl group, each substituted with at least one of a phenyl group, a biphenyl group, a naphthyl group, a pyridyl group, a pyrimidyl group, a triazinyl group, a quinolinyl group, and an isoquinolinyl group that are substituted with at least one of a phenyl group, a biphenyl group, and a pyridyl group, and <Formula 2a>

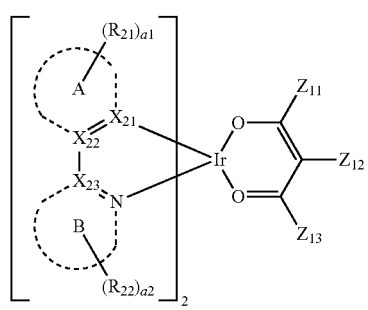

<Formula 2b>

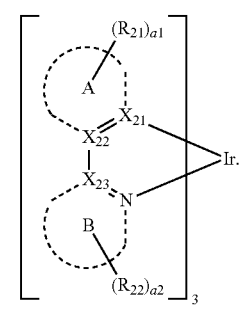

In Formulae 2a and 2b, rings A and B include respective ones of $X_{21}$ to $X_{24}$ and rings A and B are each independently selected from cyclopentene, benzene, naphthalene, fluorene, pyridine, pyridazine, quinoline, isoquinoline, benzofuran, benzothiophene, thiazole, isothiazole, oxazole, isoxazole, benzothiazole, and benzoxazole; $R_{21}$ and $R_{22}$ are each independently selected from i) a hydrogen atom, a deuterium atom —F, —Cl, a cyano group, a nitro group, —C(=O)$Q_1$ (where $Q_1$ is a methyl group or a phenyl group), a methyl group, a tert-butyl group, a methoxy group, and a tert-butoxy group; ii) a methyl group, an ethyl group, and a tert-butyl group, each substituted with at least one of a deuterium atom, —F, —Cl, a cyano group, and a nitro group; iii) a phenyl group; and iv) a phenyl group substituted with at least one of a deuterium atom, —F, —Cl, a cyano group, a nitro group, —C(=O)$Q_1$ (where $Q_1$ is a methyl group or a phenyl group), a methyl group, a tert-butyl group, a methoxy group, and a tert-butoxy group, a1 and a2 are each independently an integer from 0 to 2, when a1 is an integer of 2, two of $R_{21}$s are identical to or different from each other, and when a2 is an integer of 2, two of $R_{22}$s are identical to or different from each other. $Z_{11}$ to $Z_{13}$ are each independently selected from i) a hydrogen atom, a deuterium atom, a methyl group, an ethyl group, and a tert-butyl group; and ii) a methyl group, an ethyl group, and a tert-butyl group, each substituted with at least one of a deuterium atom, —F, a cyano group, and a nitro group.

According to one or more embodiments, an organic light-emitting device includes a first electrode, a second electrode disposed opposite to the first electrode, and an organic layer disposed between the first electrode and the second electrode and including an emission layer. The emission layer includes at least one of Compounds 1-1 to 1-21 and at least one of Compounds 2-1 to 2-28.

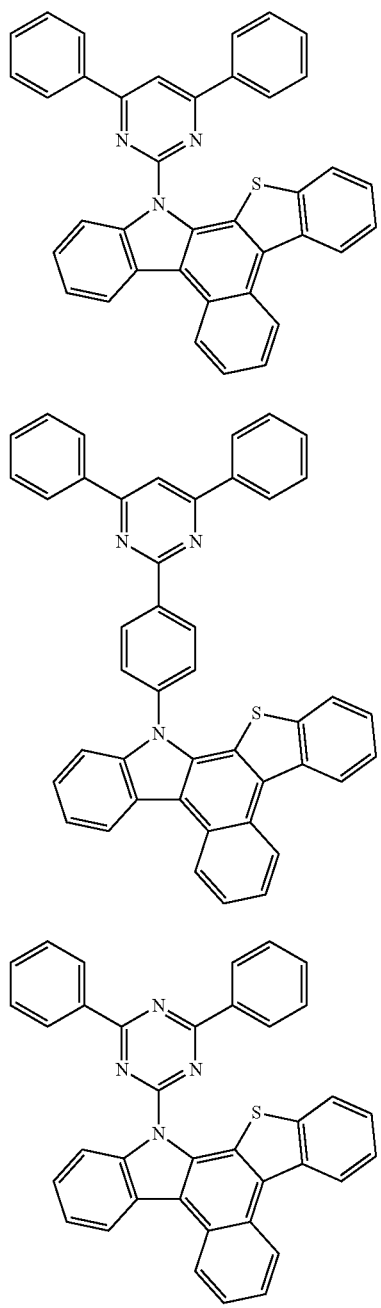

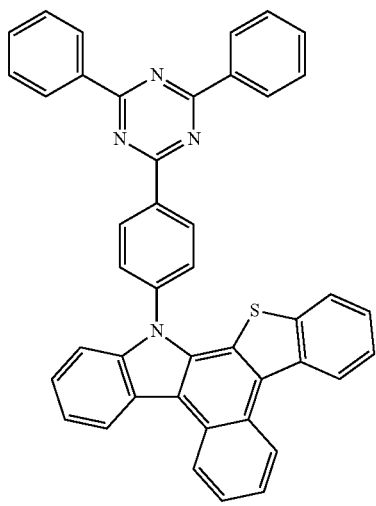

1-7
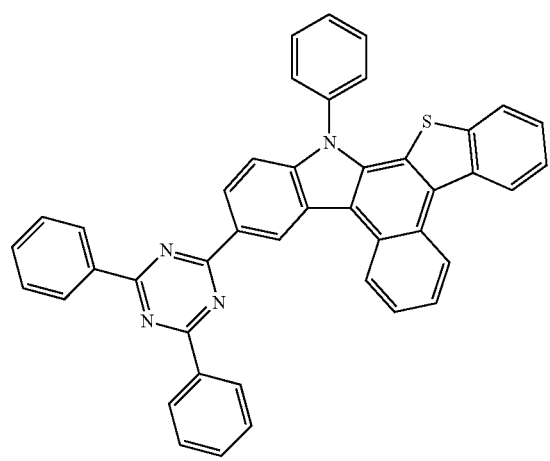
1-8
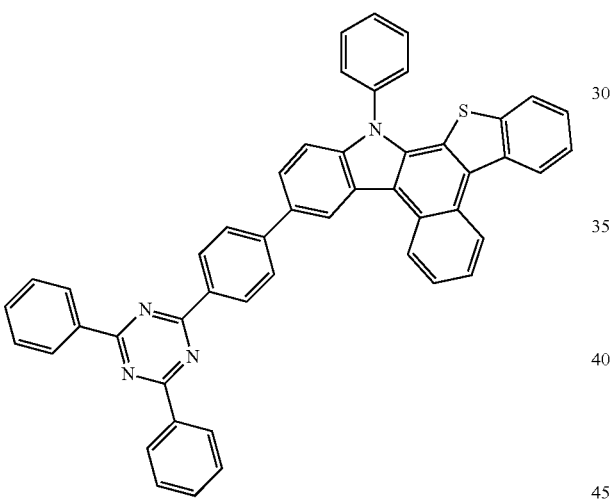
1-9
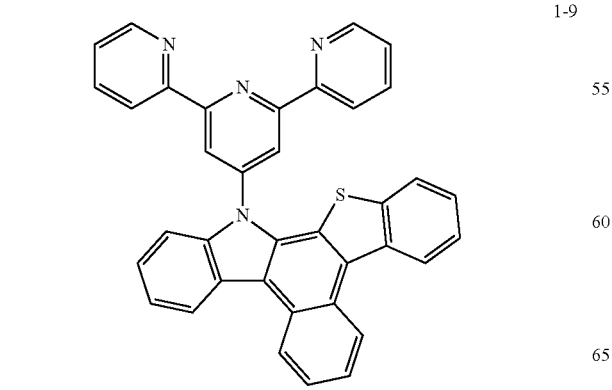
1-10
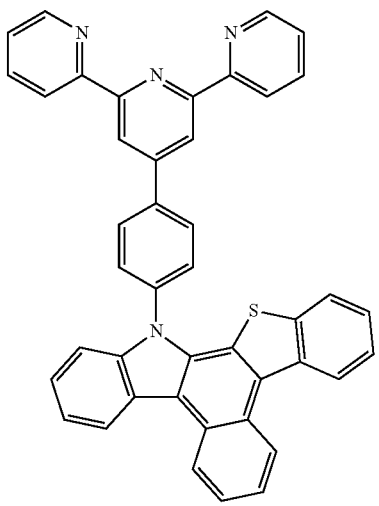
1-11
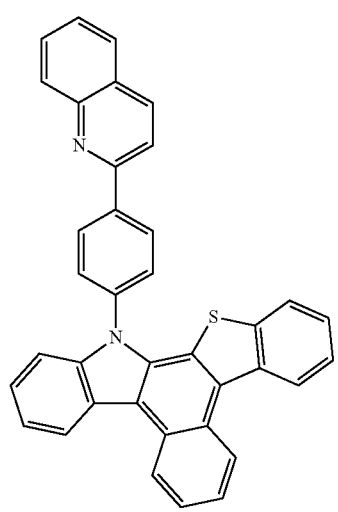
1-12
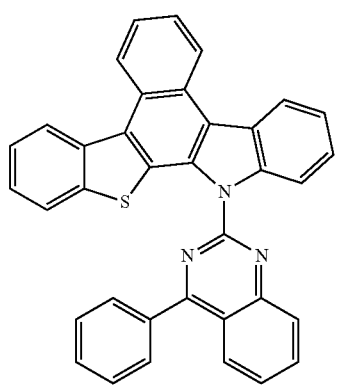

-continued
1-13
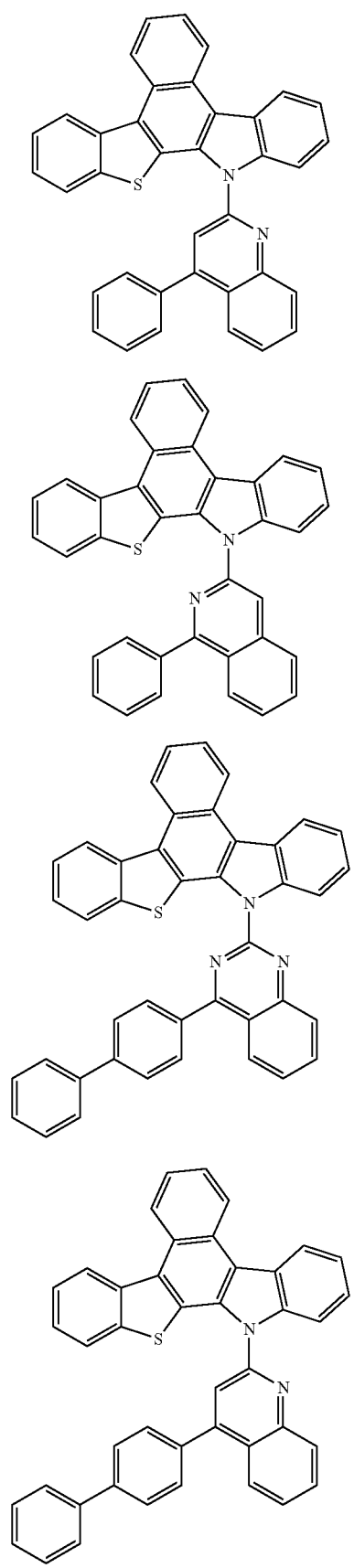
1-14
1-15
1-16
-continued
1-17
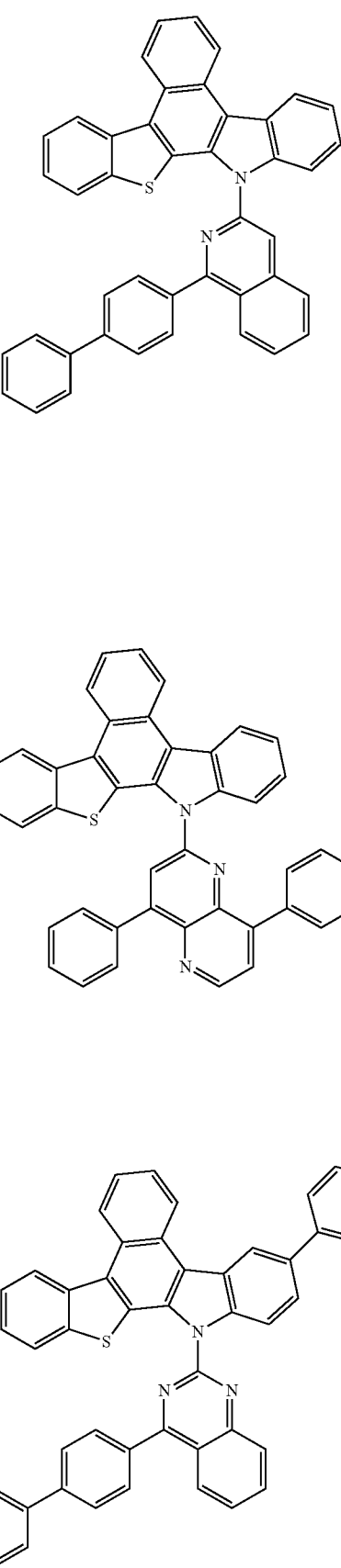
1-18
1-19

-continued 1-20

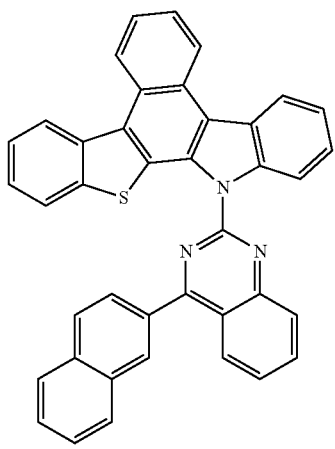

1-21

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
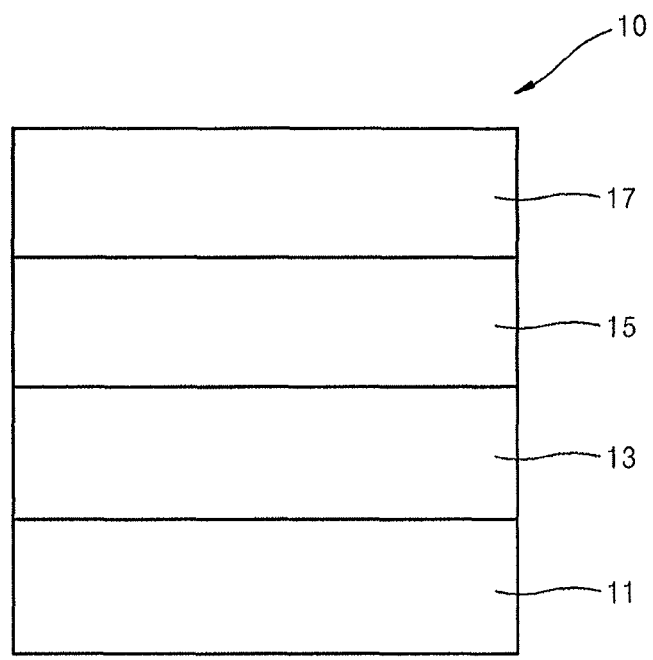
FIG. 1 illustrates a schematic view of a structure of an organic light-emitting device according to an embodiment.
Figure 2:
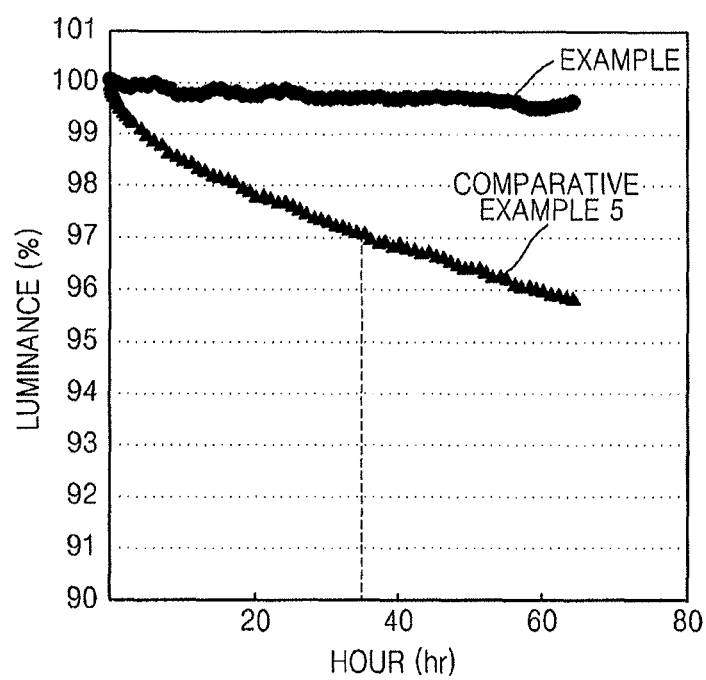
FIG. 2 illustrates a graph comparing lifetime between organic light-emitting device of Example and an organic light-emitting device of Comparative Example 5.

Example embodiments are described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout. As used herein, the term "and/or" includes any and all combinations of one or more of the associated listed items. Expressions such as "at least one of," when preceding a list of elements, modify the entire list of elements and do not modify the individual elements of the list.

The term "organic layer" as used herein refers to a single layer and/or a plurality of layers disposed between the first and second electrodes of the organic light-emitting device. As used herein, an organic layer including at least one first light-emitting material represented by Formula 1 means that the organic layer including one material selected from the group of the first light-emitting materials represented by Formula 1 or including at least two materials selected from the group of the first light-emitting materials represented by Formula 1.

FIG. 1 illustrates a schematic sectional view of an organic light-emitting device 10 according to an embodiment. A structure of an organic light-emitting device according to an embodiment and a method of manufacturing the same are described with reference to FIG. 1. Referring to FIG. 1, the organic light-emitting device 10 includes a substrate 11, a first electrode 13, an emission layer 15, and a second electrode 17, which are sequentially stacked upon one another. The substrate 11 may be any suitable substrate for an organic light-emitting device. In some embodiments the substrate 11 may be a glass substrate or a transparent plastic substrate with strong mechanical strength, thermal stability, transparency, surface smoothness, ease of handling, and water resistance.

The first electrode 13 may be formed by depositing or sputtering a first electrode-forming material on the substrate 11. When the first electrode 13 constitutes an anode, a material having a high work function may be used as the first electrode-forming material to facilitate hole injection. The first electrode 13 may be a reflective electrode or a transmission electrode. Transparent and conductive materials such as ITO, IZO, $SnO_2$, and ZnO may be used to form the first electrode. The first electrode 13 may be formed as a reflective electrode using magnesium (Mg), aluminum (Al), aluminum-lithium (Al—Li), calcium (Ca), magnesium-indium (Mg—In), magnesium-silver (Mg—Ag), or the like. The first electrode 13 may have a single-layer structure or a multi-layer structure including at least two layers. For example, the first electrode 13 may have a three-layered structure of ITO/Ag/ITO, or the like.

The organic layer 15 may be disposed on the first electrode 13. The organic layer 15 may include a hole injection layer (HIL), a hole transport layer (HTL), a H-functional layer having both hole injection and hole transport capabilities, a buffer layer, an emission layer (EML), an electron transport layer (ETL), and an electron injection layer (EIL).

The HIL may be formed on the first electrode 13 by any of a variety of methods, including vacuum deposition, spin coating, casting, Langmuir-Blodgett (LB) deposition, and the like. When the HIL is formed using vacuum deposition, vacuum deposition conditions may vary depending on the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. When the HIL is formed using spin coating, the coating conditions may vary depending on the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C.

A material for forming the HIL may be a suitable hole injecting material. Examples of the hole injecting material include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4''-tris(3-methylphenylphenylamino) triphenylamine (m-MTDATA), N,N'-di(1-naphthyl)-N,N'-diphenylbenzidine (NPB), TDATA, 2-TNATA, polyaniline/dodecylbenzene sulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

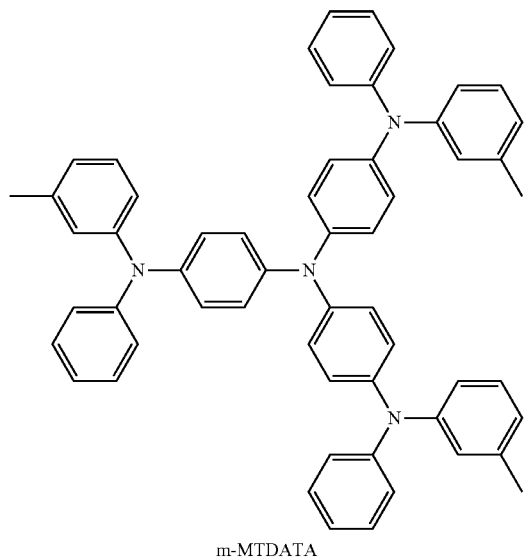

m-MTDATA

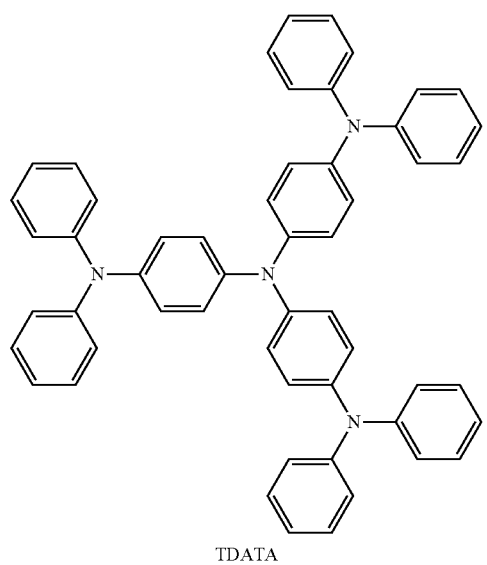

TDATA

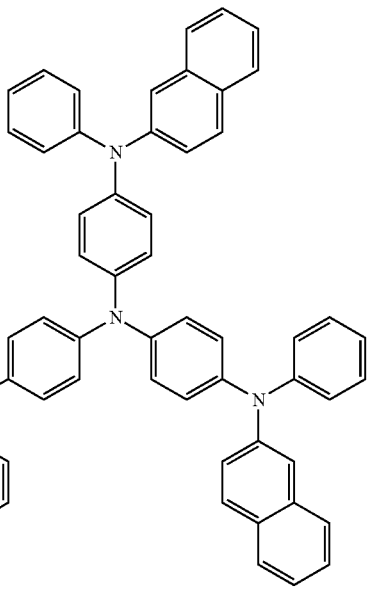

2-TNATA

The thickness of the HIL may be about 100 Å to about 10000 Å, and in some embodiments, may be from about 100 Å to about 1000 Å. When the thickness of the HIL is within these ranges, the HIL may have good hole injecting ability without a substantial increase in driving voltage.

Then, a HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary depending on the material that is used to form the HTL.

Examples of suitable HTL forming materials include carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine) (NPB).

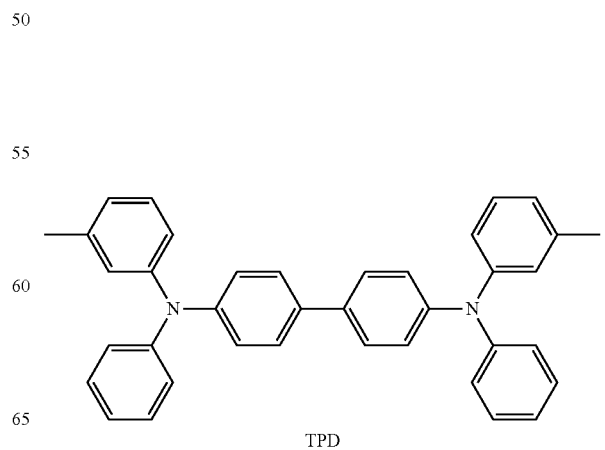

TPD

-continued

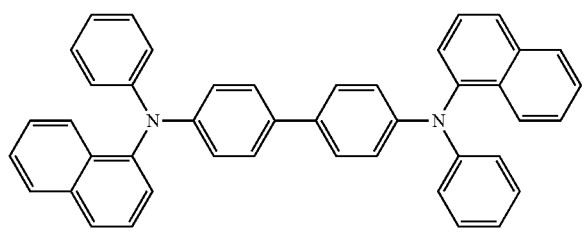
<NPB>

The thickness of the HTL may be from about 50 Å to about 2000 Å, and in some embodiments, may be from about 100 Å to about 1500 Å. When the thickness of the HTL is within these ranges, the HTL may have good hole transporting ability without a substantial increase in driving voltage.

The H-functional layer having both hole injection and hole transport capabilities may contain at least one material from each group of the hole injection layer materials and hole transport layer materials. The thickness of the H-functional layer may be from about 100 Å to about 10,000 Å, and in some embodiments, may be from about 100 Å to about 1,000 Å. When the thickness of the H-functional layer is within these ranges, the H-functional layer may have good hole injection and transport capabilities without a substantial increase in driving voltage.

In some embodiments, at least one of the HIL, HTL, and H-functional layer may include at least one of a compound of Formula 300 and a compound of Formula 301:

<Formula 300>

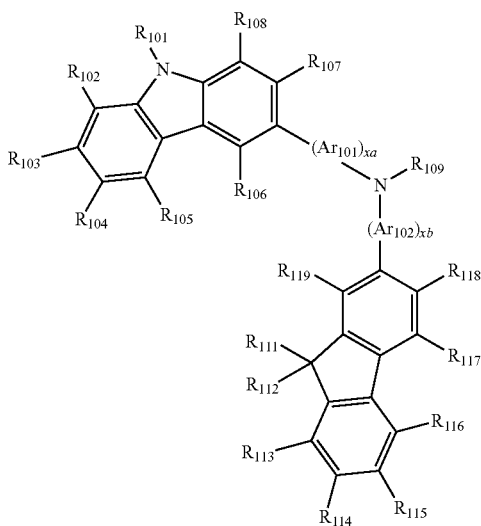

<Formula 301>

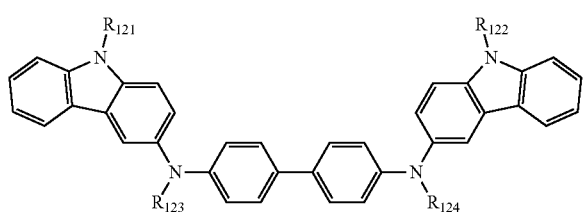

In Formula 300, $Ar_{101}$ and $Ar_{102}$ may be each independently a substituted or unsubstituted $C_6$-$C_{60}$ arylene group.

In some embodiments, $Ar_{101}$ and $Ar_{102}$ may be each independently one of a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthracenylene group, a fluoranthenylene group, a triphenylenylene group, a pyrenylenylene group, a chrysenylene group, a naphthacenylene group, a picenylene group, a perylenylene group, and a pentacenylene group; and a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthracenylene group, a fluoranthenylene group, a triphenylenylene group, a pyrenylenylene group, a chrysenylene group, a naphthacenylene group, a picenylene group, a perylenylene group, and a pentacenylene group that are substituted with at least one of a deuterium atom, a halogen atom, a hydroxyl group, a nitro group, a cyano group, an amino group, an amidino group, hydrazine, hydrazone, a carboxyl group or salt thereof, a sulfuric acid group or salt thereof, a phosphoric acid group or salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

In Formula 300, xa and xb may each independently be an integer from 0 to 5, for example, may be 0, 1, or 2. For example, xa may be 1, and xb may be 0. In Formulae 300 and 301, $R_{101}$ to $R_{108}$, $R_{111}$ to $R_{119}$, and $R_{121}$ to $R_{124}$ may each independently be a hydrogen atom, a deuterium atom, a halogen atom, a hydroxyl group, a cyano group, a nitro group, an amino group, an amidino group, a hydrazine group, a hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group.

In some embodiments, $R_{51}$ to $R_{58}$, $R_{61}$ to $R_{69}$, $R_{71}$, and $R_{72}$ may each independently be one of a hydrogen atom; a deuterium atom; a halogen atom; a hydroxyl group; a cyano group; a nitro group; an amino group; an amidino group; a hydrazine; a hydrazone; a carboxylic acid group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group that are substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, and a phosphoric acid group or a salt thereof; a phenyl group; a naphthyl group; an anthryl group; a fluorenyl group; a pyrenyl group; and a phenyl group, a naphthyl group, an anthryl group, a fluorenyl group, and a pyrenyl group that are substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group.

In Formula 300, $R_{109}$ may be one of a phenyl group, a naphthyl group, an anthryl group, a biphenyl group, a pyridyl group; and a phenyl group, a naphthyl group, an anthryl group, a biphenyl group, and a pyridyl group that are substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In an embodiment the compound of Formula 300 may be a compound represented by Formula 300A:

<Formula 300A>

In Formula 300A, $R_{101}$, $R_{111}$, $R_{112}$, and $R_{109}$ may be as defined herein. For example, at least one of the HIL, HTL, and H-functional layer may include at least one of compounds represented by Formulae 301 to 320:

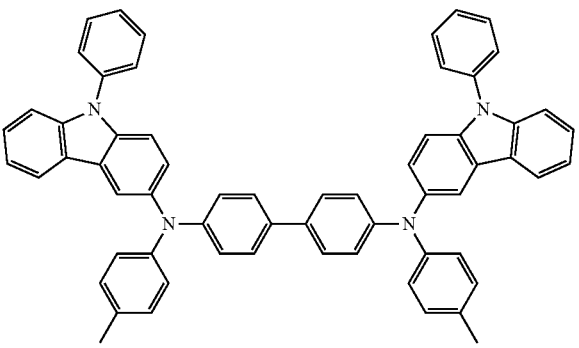

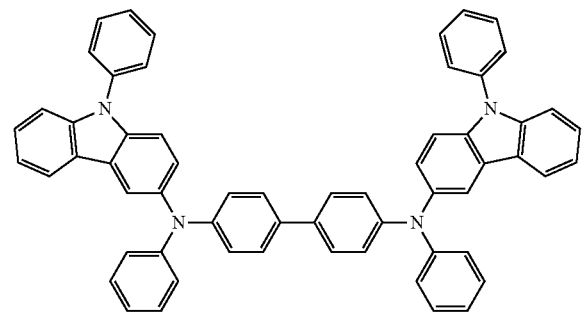

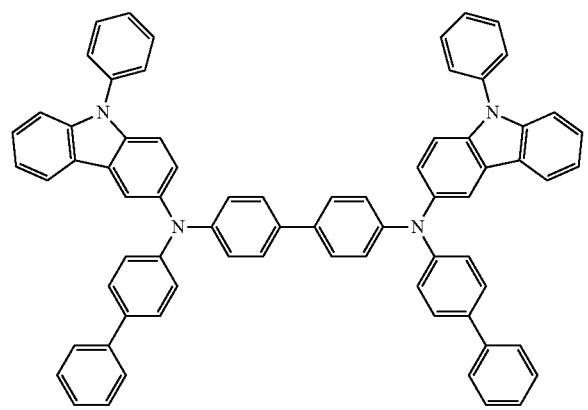
306
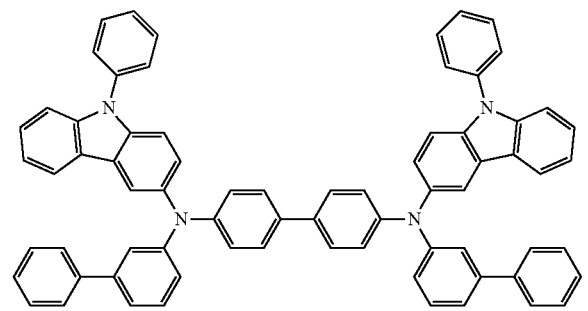
307
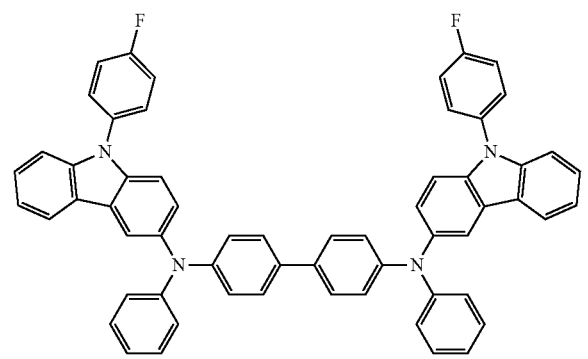
308
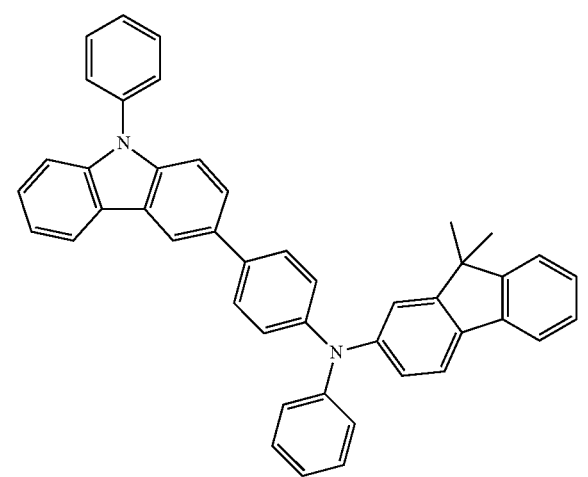
309
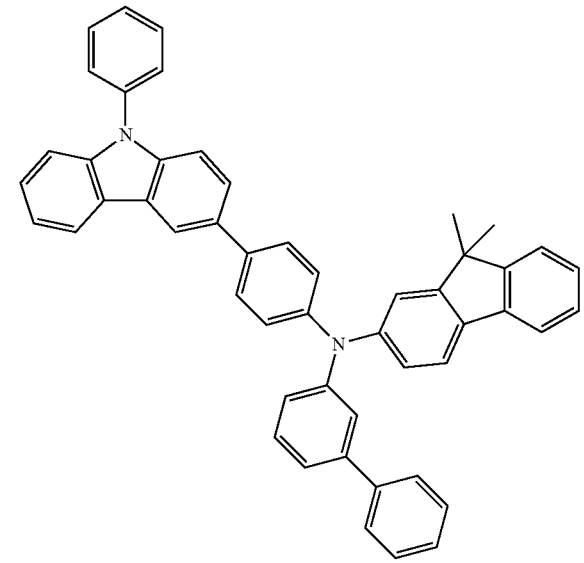
310
311

312
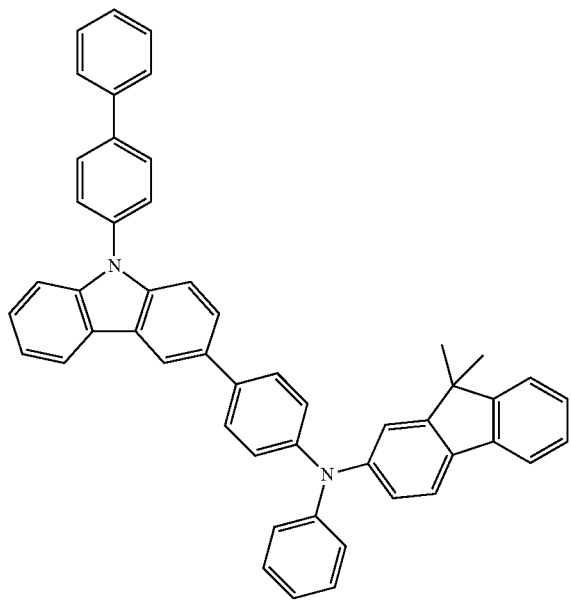
313
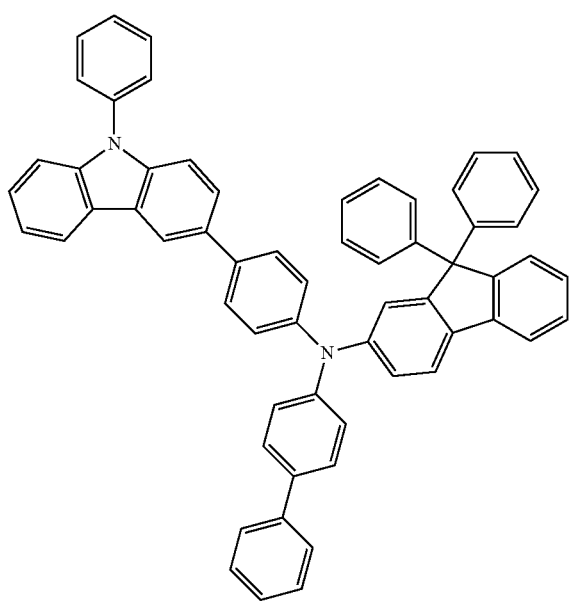
314
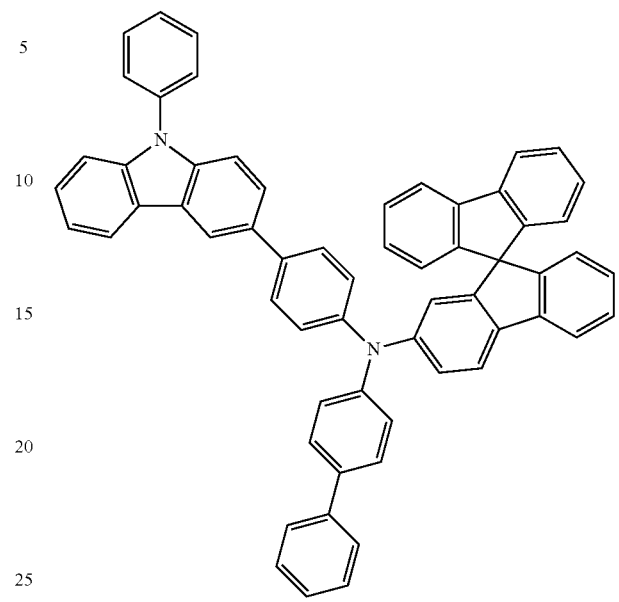
315
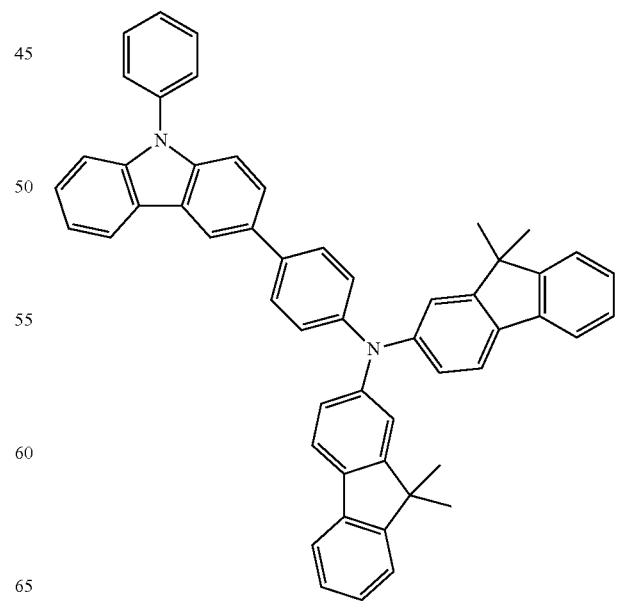

-continued

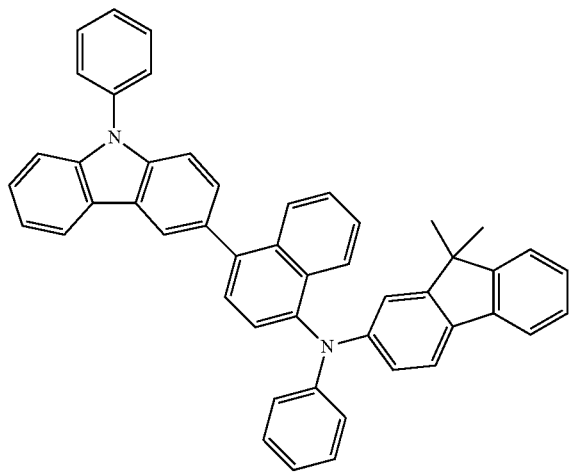

316

317

318

-continued

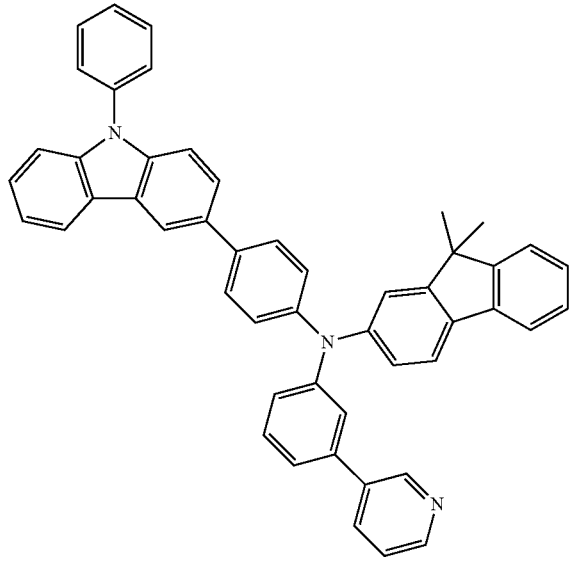

319

320

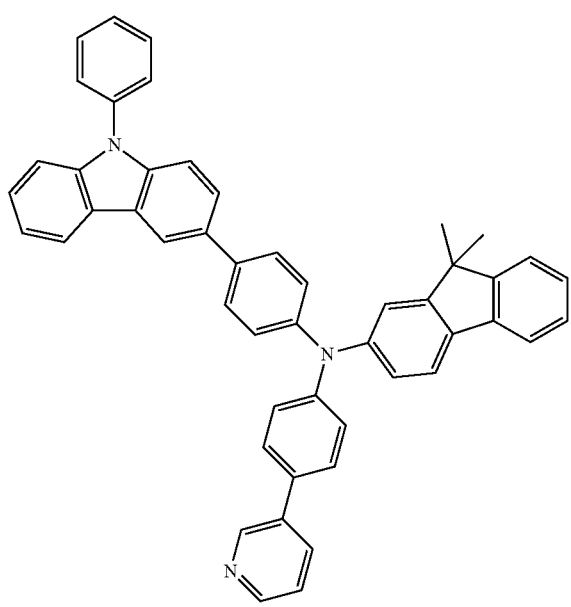

At least one of the HIL, HTL, and H-functional layer may further include a charge-generating material for improved layer conductivity, in addition to a suitable hole injecting material, hole transport material, and/or material having both hole injection and hole transport capabilities as described herein.

The charge-generating material may be, for example, a p-dopant. For example, the p-dopant may be one of quinine derivatives, metal oxides, and compounds with a cyano group, or the like. Examples of the p-dopant include quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound.

<Compound 200>

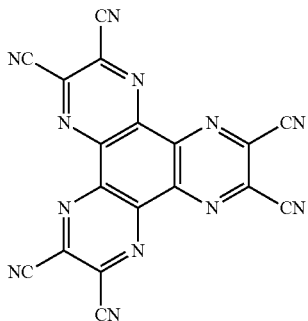

<F4-TCNQ>

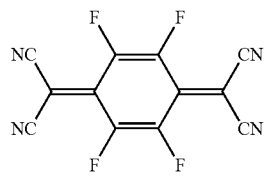

When the hole injection layer, hole transport layer, or H-functional layer further includes a charge-generating material, the charge-generating material may be homogeneously dispersed or non-homogeneously distributed in the layer.

A buffer layer may be disposed between at least one of the HIL, HTL, and H-functional layer, and the EML. The buffer layer may compensate for an optical resonance distance of light according to a wavelength of the light emitted from the EML, and thus may increase efficiency. The butter layer may include any suitable hole injecting material or hole transporting material. In some other embodiments, the buffer layer may include the same material as one of the materials included in the HIL, HTL, and H-functional layer that underlie the buffer layer.

Then, an EML may be formed on the HTL, Ht-functional layer, or buffer layer by vacuum deposition, spin coating, casting, Langmuir-Blodget (LB) deposition, or the like. When the EML is formed using vacuum deposition or spin coating, the deposition and coating conditions may be similar to those for the formation of the HIL, though the conditions for deposition and coating may vary depending on the material that is used to form the EML. The EML may include at least one material selected from the first light-emitting materials represented by Formula 1. The EML may include at least one material selected from the second light-emitting materials represented by Formula 2.

<Formula 1>

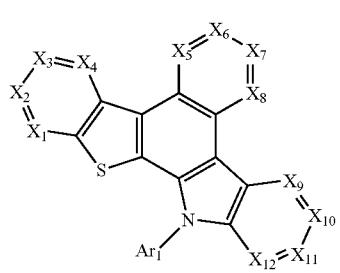

<Formula 2>

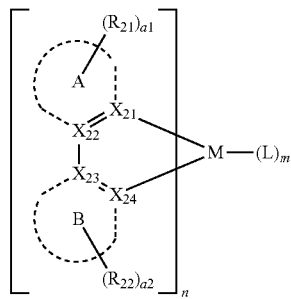

The first light-emitting material may serve as a host, and the second light-emitting material may serve as a dopant. For example, the first light-emitting material may serve as a red host. The second light-emitting material may serve as a red phosphorescent dopant emitting red light based on phosphorescence mechanism. A weight ratio of the first light-emitting material and the second light-emitting material in the emission layer may be from about 99.9:0.01 to about 80:20.

In Formula 1, $X_1$ may be $CR_1$ or N; $X_2$ may be $CR_2$ or N; $X_3$ may be $CR_3$ or N; $X_4$ may be $CR_4$ or N; $X_5$ may be $CR_5$ or N; $X_6$ may be $CR_6$ or N; $X_7$ may be $CR_7$ or N; $X_8$ may be $CR_8$ or N; $X_9$ may be $CR_9$ or N; $X_{10}$ may be $CR_{10}$ or N; $X_{11}$ may be $CR_{11}$ or N; and $X_{12}$ may be $CR_{12}$ or N. For example, in Formula 1, $X_1$ may be $CR_1$; $X_2$ may be $CR_2$; $X_3$ may be $CR_3$; $X_4$ may be $CR_4$; $X_5$ may be $CR_5$; $X_6$ may be $CR_6$; $X_7$ may be $CR_7$; $X_8$ may be $CR_8$; $X_9$ may be $CR_9$; $X_{10}$ may be $CR_{10}$; $X_{11}$ may be $CR_{11}$; and $X_{12}$ may be $CR_{12}$.

In Formula 1, $R_1$ to $R_{12}$ may each independently be selected from a hydrogen atom, a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, —C(=O)$Q_1$ (where $Q_1$ is a $C_1$-$C_{10}$ alkyl group, a $C_6$-$C_{10}$ aryl group, or a $C_6$-$C_{60}$ aryloxy group), a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_2$-$C_{60}$ heterocycloalkyl group, a substituted or unsubstituted $C_3$-$C_{60}$ cycloalkenyl group, a substituted or unsubstituted $C_2$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 1, $R_1$ to $R_{12}$ may each independently be selected from i) a hydrogen atom, a deuterium atom, a halogen atom, a hydroxyl group, a cyano group, a nitro group, and a $C_1$-$C_{60}$ alkyl group; ii) a $C_6$-$C_{16}$ aryl group and a $C_2$-$C_{16}$ heteroaryl group; and iii) a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, and a $C_1$-$C_{10}$ alkyl group; a $C_1$-$C_{10}$ alkyl group substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, and a phosphoric acid group or a salt thereof; a $C_6$-$C_{16}$ aryl group and a $C_2$-$C_{16}$ heteroaryl group; and a $C_6$-$C_{16}$ aryl group and a $C_2$-$C_{16}$ heteroaryl group, each substituted with at least one of a deuterium atom, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{10}$ alkyl group, a $C_2$-$C_{10}$ alkenyl group, a $C_2$-$C_{10}$ alkynyl group, a $C_1$-$C_{10}$ alkoxy group, a $C_6$-$C_{16}$ aryl group, and a $C_2$-$C_{16}$ heteroaryl group, or the like.

In some embodiments, R1 to R12 in Formula 1 may each independently be selected from i) a hydrogen atom, a deuterium atom, a halogen atom, a cyano group, and a nitro group; ii) a $C_6$-$C_{16}$ aryl group and a $C_2$-$C_{16}$ heteroaryl group; iii) a $C_6$-$C_{16}$ aryl group and a $C_2$-$C_{16}$ heteroaryl group, each substituted with at least one of a $C_6$-$C_{16}$ alkyl group, and a $C_2$-$C_{16}$ alkoxy group; and iv) a $C_6$-$C_{16}$ aryl group and a $C_2$-$C_{16}$ heteroaryl group, each substituted with at least one of a $C_6$-$C_{16}$ aryl group and a $C_2$-$C_{16}$ heteroaryl group that are substituted with at least one of a $C_6$-$C_{16}$ aryl group and a $C_2$-$C_{16}$ heteroaryl group, or the like.

In some other embodiments, R1 to R12 in Formula 1 may each independently be selected from i) a hydrogen atom, a deuterium atom, a halogen atom, a cyano group, and a nitro group; ii) a phenyl group, a naphthyl group, and an anthryl group; iii) a pyridyl group, a pyrimidyl group, and a triazinyl group, each substituted with at least one of a phenyl group, a naphthyl group, and anthryl group; and iv) a phenyl group, a naphthyl group, and an anthryl group, each substituted with at least one of a pyridyl group, a pyrimidyl group, and a triazinyl group that are substituted with at least one of a phenyl group, a naphthyl group, and anthryl group, or the like.

In some other embodiments. R1 to R12 in Formula 1 may each independently be selected from i) a hydrogen atom; ii) a phenyl group; iii) a pyrimidyl group and a triazinyl group, each substituted with a phenyl group; and iv) a phenyl group substituted with at least one of a pyrimidyl group and a triazinyl group that are substituted with a phenyl group, or the like.

For example, $Ar_1$ in Formula 1 may be selected from i) a phenyl group, a biphenyl group, a pentalenyl group, an indenyl group, a naphthyl group, an azulenyl group, a heptalenyl group, an indacenyl group, an acenaphtyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, and a benzocarbazolyl group; and ii) a phenyl group, a biphenyl group, a pentalenyl group, an indenyl group, a naphthyl group, an azulenyl group, a heptalenyl group, an indacenyl group, an acenaphtyl group, a fluorenyl group, a spiro-fluorenyl group, a phenalenyl group, a phenanthrenyl group, an anthryl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridyl group, a pyrazinyl group, a pyrimidyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzoxazolyl group, a dibenzofuranyl group, a dibenzothiophenyl group, and a benzocarbazolyl group, each substituted with at least one of a deuterium atom, a halogen atom, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_2$-$C_{60}$ heterocycloalkyl group, a substituted or unsubstituted $C_3$-$C_{60}$ cycloalkenyl group, a substituted or unsubstituted $C_2$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group, but is not limited thereto.

In Formula 1. $Ar_1$ may be selected from i) a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_1$-$C_{60}$ aryl group, and a $C_2$-$C_{60}$ heteroaryl group; and ii) a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, and a $C_2$-$C_{60}$ heteroaryl group, each substituted with at least one of a deuterium atom, a halogen atom, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_2$-$C_{60}$ heterocycloalkyl group, a substituted or unsubstituted $C_3$-$C_{60}$ cycloalkenyl group, a substituted or unsubstituted $C_2$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

In some embodiments, Ar1 in Formula 1 may be selected from i) a phenyl group, a naphthyl group, a pyridyl group, a pyrimidyl group, a triazinyl group, a quinolinyl group, an isoquinolinyl group, a naphthyridinyl group, and a quinazolinyl group; ii) a phenyl group, a naphthyl group, a pyridyl group, a pyrimidyl group, a triazinyl group, a quinolinyl group, an isoquinolinyl group, a naphthyridinyl group, and a quinazolinyl group, each substituted with at least one of a $C_6$-$C_{60}$ aryl group and a $C_2$-$C_{60}$ heteroaryl group; and iii) a phenyl group, a naphthyl group, a pyridyl group, a pyrimidyl group, a triazinyl group, a quinolinyl group, an isoquinolinyl group, a naphthyridinyl group, and a quinazolinyl group, each substituted with at least one of a $C_6$-$C_{60}$ aryl group and a $C_2$-$C_{60}$ heteroaryl group that are substituted with at least one of a $C_6$-$C_{60}$ aryl group and a $C_2$-$C_{60}$ heteroaryl group, or the like.

In some other embodiments, Ar1 in Formula 1 may be selected from i) a phenyl group, a naphthyl group, a pyridyl group, a pyrimidyl group, a triazinyl group, a quinolinyl group, an isoquinolinyl group, a naphthyridinyl group, and a quinazolinyl group; ii) a phenyl group, a naphthyl group, a pyridyl group, a pyrimidyl group, a triazinyl group, a quinolinyl group, an isoquinolinyl group, a naphthyridinyl group, and a quinazolinyl group, each substituted with at least one of a phenyl group, a biphenyl group, a naphthyl group, a pyridyl group, a pyrimidyl group, a triazinyl group, a quinolinyl group, and isoquinolinyl group; and iii) a phenyl group, a naphthyl group, a pyridyl group, a pyrimidyl group, a triazinyl group, a quinolinyl group, an isoquinolinyl group, a naphthyridinyl group, and a quinazolinyl group, each substituted with at least one of a phenyl group, a biphenyl group, a naphthyl group, a pyridyl group, a pyrimidyl group, a triazinyl group, a quinolinyl group, and an isoquinolinyl group that are substituted with at least one of a phenyl group, a biphenyl group, a naphthyl group, a pyridyl group, a pyrimidyl group, a triazinyl group, a quinolinyl group, and isoquinolinyl group, or the like.

In some other embodiments, Ar1 in Formula 1 may be selected from i) a phenyl group and a naphthyl group; ii) a phenyl group, a pyridyl group, a quinolinyl group, an isoquinolinyl group, a naphthyridinyl group, and a quinazolinyl group, each substituted with at least one of a phenyl group, a biphenyl group, a pyridnyl group, a quinolinyl group, and isoquinolinyl group; and iii) a phenyl group, a pyridyl group, a quinolinyl group, an isoquinolinyl group, a naphthyridinyl group, and a quinazolinyl group, each substituted with at least one of a phenyl group, a biphenyl group, a naphthyl group, a pyridyl group, a pyrimidyl group, a triazinyl group, a quinolinyl group, and an isoquinolinyl group that are substituted with at least one of a phenyl group, a biphenyl group, and a pyridyl group, or the like.

In some embodiments, the first light-emitting material represented by Formula 1 may be a material represented by Formula 1a:

<Formula 1a>

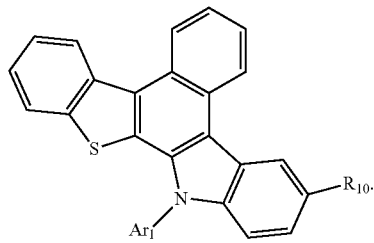

In Formula 1a, $R_{10}$ may be selected from i) a hydrogen atom; ii) a phenyl group; iii) a pyrimidyl group and a triazinyl group, each substituted with a phenyl group; and iv) a phenyl group substituted with at least one of a pyrimidyl group and a triazinyl group that are substituted with a phenyl group.

Ar1 may be selected from i) a phenyl group and a naphthyl group; ii) a phenyl group, a pyridyl group, a quinolinyl group, an isoquinolinyl group, a naphthyridinyl group, and a quinazolinyl group, each substituted with at least one of a phenyl group, a biphenyl group, a pyridnyl group, a quinolinyl group, and isoquinolinyl group; and iii) a phenyl group, a pyridyl group, a quinolinyl group, an isoquinolinyl group, a naphthyridinyl group, and a quinazolinyl group, each substituted with at least one of a phenyl group, a biphenyl group, a naphthyl group, a pyridyl group, a pyrimidyl group, a triazinyl group, a quinolinyl group, and an isoquinolinyl group that are substituted with at least one of a phenyl group, a biphenyl group, and a pyridyl group.

In some other embodiments, the first light-emitting material represented by Formula 1 may be one of Compounds 1-1 to 1-21:

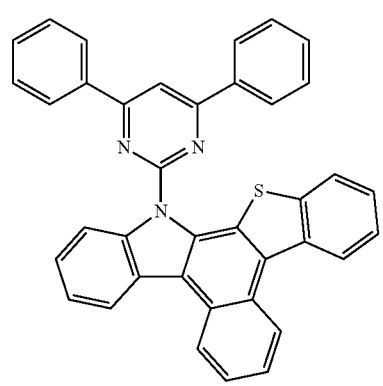

1-1

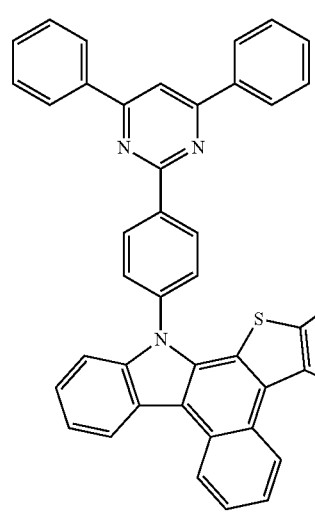

1-2

1-3
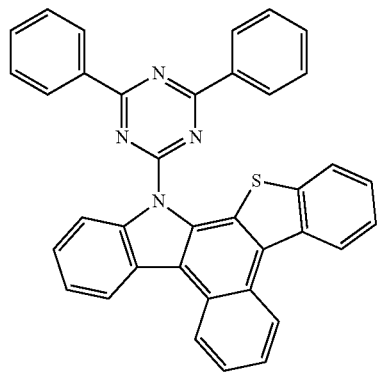
1-4
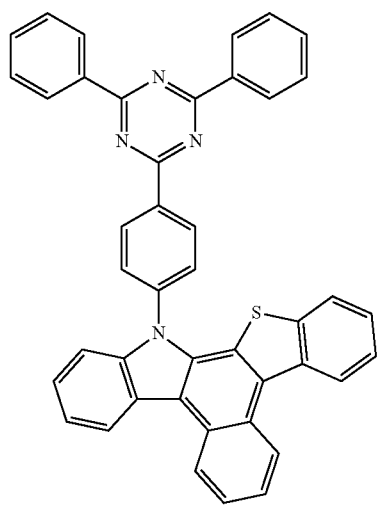
1-5
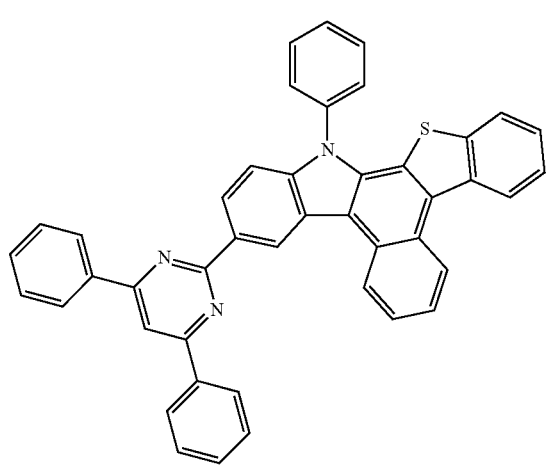
1-6
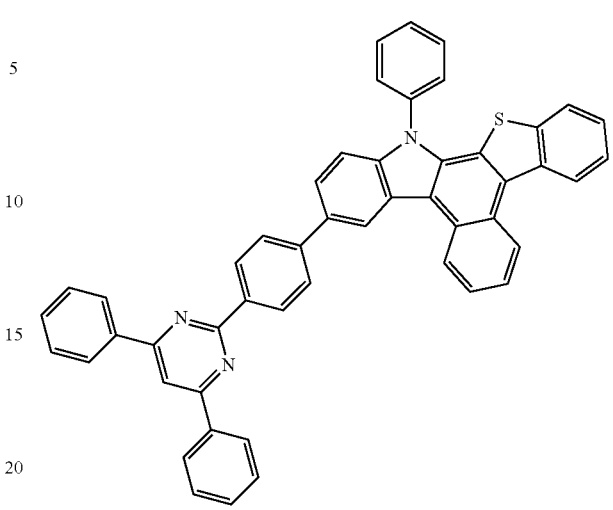
1-7
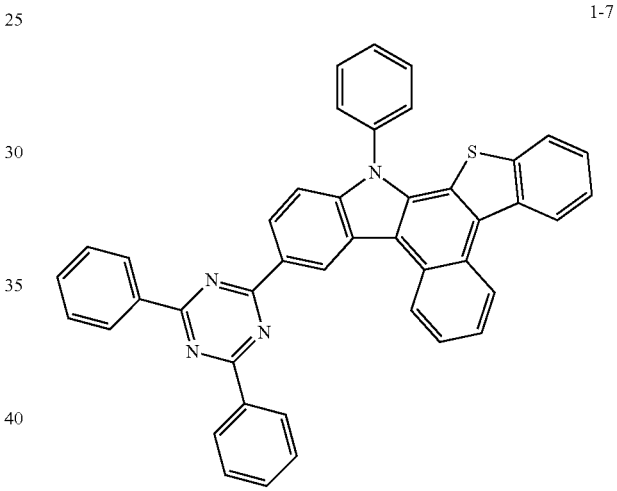
1-8
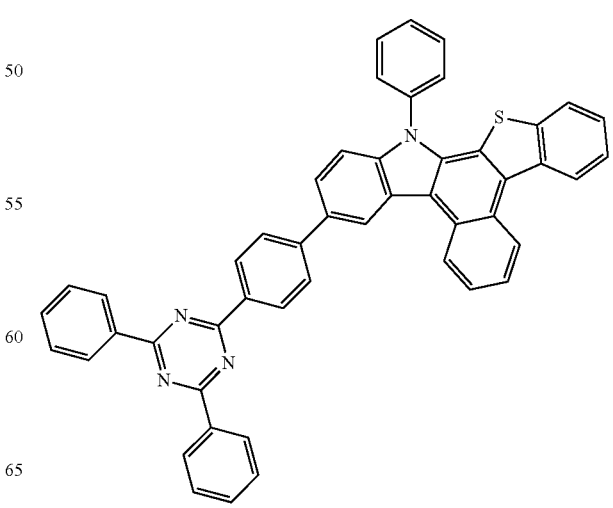

51
-continued
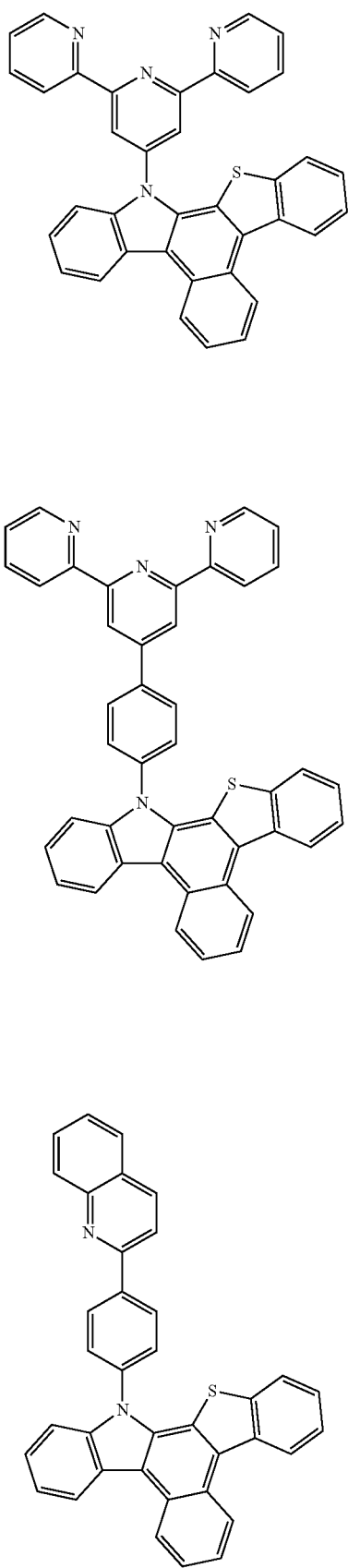
1-9
1-10
1-11
52
-continued
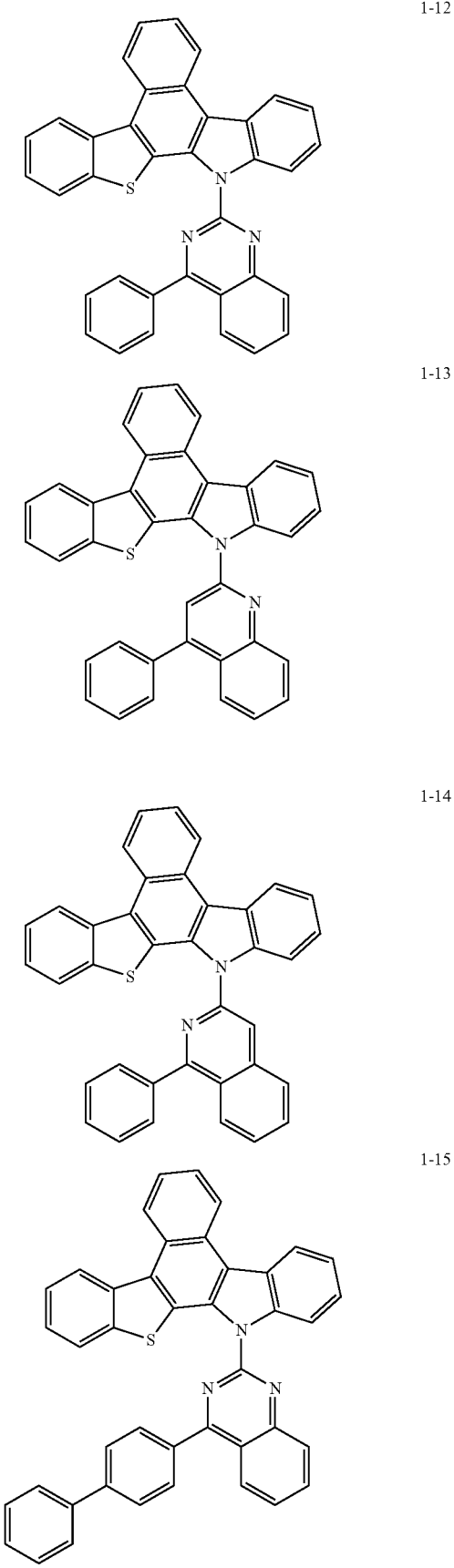
1-12
1-13
1-14
1-15

-continued 1-16
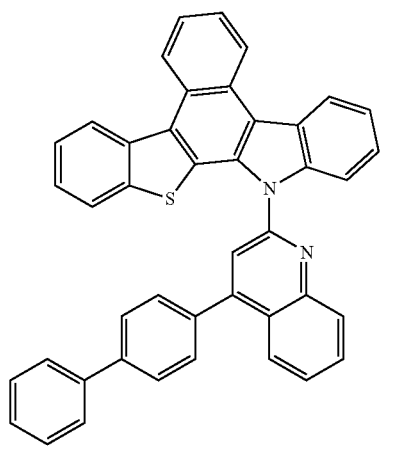

1-17
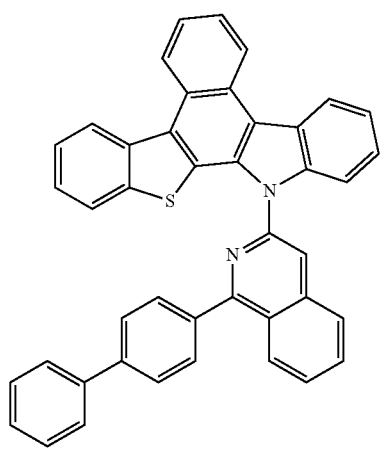

1-18
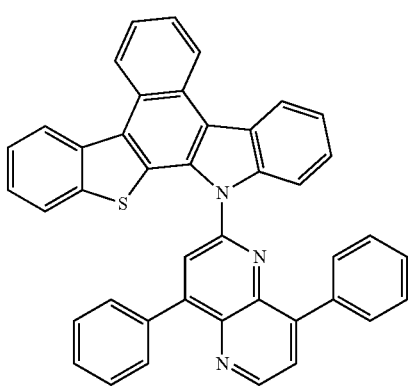

-continued 1-19
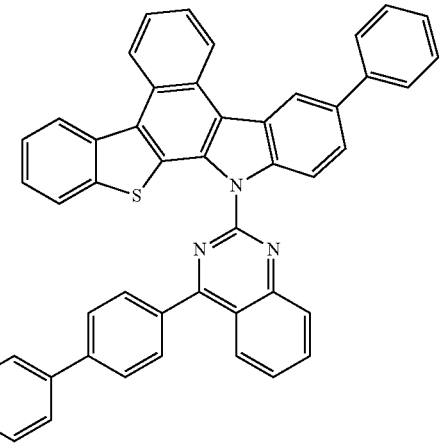

1-20
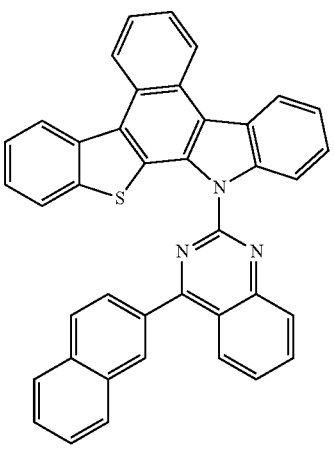

1-21
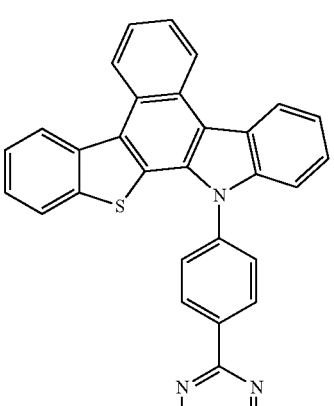

In Formula 2, M may be a transition metal having an atomic weight of 40 or greater. In some embodiments, M in Formula 2 may be selected from iridium (Ir), platinum (Pt), osmium (Os), lead (Pb), rhenium (Re), ruthenium (Ru), and palladium (Pd). For example, M in Formula 2 may be selected from iridium (Ir), platinum (Pt), osmium (Os), and ruthenium (Ru), or the like. For example, M in Formula 2 may be iridium (Ir), or the like.

In Formula 2, $X_{21}$ to $X_{24}$ may each independently be a carbon atom or a nitrogen atom. For example, at least one of $X_{21}$ and $X_{24}$ in Formula 2 may be a nitrogen atom. In Formula 2, rings A and B include respective ones of $X_{21}$ to $X_{24}$ and rings A and B may each independently be selected from a $C_4$-$C_{20}$ cycloalkyl group, a $C_2$-$C_{20}$ heterocycloalkyl group, a $C_6$-$C_{20}$ aryl group, and a $C_2$-$C_{20}$ heteroaryl group. For example, at least one of rings A and B in Formula 2 may be a $C_2$-$C_{60}$ heteroaryl group including at least one nitrogen atom as a ring member, or the like.

In some embodiments, rings A and B in Formula 2 may each independently be selected from cyclopentene, cyclohexene, benzene, naphthalene, indene, fluorene, pyrrole, imidazole, pyrazole, pyridine, pyrazine, pyrimidine, pyridazine, indole, quinoline, isoquinoline, benzimidazole, furan, benzofuran, thiophene, benzothiophene, thiazole, isothiazole, oxazole, isoxazole, benzothiazole, and benzoxazole, or the like. In some other embodiments, rings A and B in Formula 2 may each independently be selected from cyclopentene, benzene, naphthalene, fluorene, pyridine, pyridazine, quinoline, isoquinoline, benzofuran, benzothiophene, thiazole, isothiazole, oxazole, isoxazole, benzothiazole, and benzoxazole, or the like.

In Formula 2, $R_{21}$ and $R_{22}$ may each independently be selected from a hydrogen atom, a deuterium atom, a halogen atom, a cyano group, a nitro group, an amino group, an amidino group, a hydrazine, a hydrazone, a carboxyl group or a salt thereof, a sulfonic acid group or a salt thereof, a phosphoric acid group or a salt thereof, $-C(=O)Q_1$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group, where $Q_1$ may be a $C_1$-$C_{10}$ alkyl group, a $C_6$-$C_{10}$ aryl group, or a $C_6$-$C_{60}$ aryloxy group.

For example, $R_{21}$ and $R_{22}$ in Formula 2 may each independently be selected from i) a hydrogen atom, a deuterium atom, a halogen atom, a hydroxyl group, a cyano group, a nitro group, $-C(=O)Q1$, a C1-C60 alkyl group, and a $C_1$-$C_{60}$ alkoxy group; ii) a $C_1$-$C_{60}$ alkyl group, and a $C_1$-$C_{60}$ alkoxy group, each substituted with at least one of a deuterium atom, a halogen atom, a hydroxyl group, a cyano group, and a nitro group; iii) a $C_6$-$C_{60}$ aryl group and a $C_2$-$C_{60}$ heteroaryl group; and iv) a $C_6$-$C_{60}$ aryl group and a $C_2$-$C_{60}$ heteroaryl group, each substituted with at least one of a deuterium atom, a halogen atom, a hydroxyl group, a cyano group, a nitro group, $-C(=O)Q1$, a C1-C60 alkyl group, and a $C_1$-$C_{60}$ alkoxy group; where Q1 is a $C_1$-$C_{10}$ alkyl group, a $C_6$-$C_{10}$ aryl group, or a $C_6$-$C_{60}$ aryloxy group.

In some embodiments, $R_{21}$ and $R_{22}$ in Formula 2 may each independently be selected from i) a hydrogen atom, a deuterium atom —F, —Cl, a cyano group, a nitro group, $-C(=O)Q_1$ (where $Q_1$ is a methyl group, an ethyl group, a phenyl group, or a phenoxy group), a methyl group, an ethyl group, a tert-butyl group, a methoxy group, and a tert-butoxy group; ii) a methyl group, an ethyl group, a tert-butyl group, a methoxy group, and a tert-butoxy group, each substituted with at least one of a deuterium atom, —F, —Cl, a cyano group, and a nitro group; iii) a phenyl group, a naphthyl group, and a pyridyl group; and iv) a phenyl group, a naphthyl group, and a pyridyl group, each substituted with at least one of a deuterium atom, —F, —Cl, a cyano group, a nitro group, $-C(=O)Q_1$ (where $Q_1$ may be a methyl group, an ethyl group, a phenyl group, or a phenoxy group), a methyl group, an ethyl group, a tert-butyl group, a methoxy group, an ethoxy group, and a tert-butoxy group, or the like.

In some other embodiments, $R_{21}$ and $R_{22}$ in Formula 2 may each independently be selected from i) a hydrogen atom, a deuterium atom —F, —Cl, a cyano group, a nitro group, $-C(=O)Q_1$ (where $Q_1$ is a methyl group or a phenyl group), a methyl group, a tert-butyl group, a methoxy group, and a tert-butoxy group; ii) a methyl group, an ethyl group, and a tert-butyl group, each substituted with at least one of a deuterium atom, —F, —Cl, a cyano group, and a nitro group; iii) a phenyl group; and iv) a phenyl group substituted with at least one of a deuterium atom, —F, —Cl, a cyano group, a nitro group, $-C(=O)Q_1$ (where $Q_1$ is a methyl group or a phenyl group), a methyl group, a tert-butyl group, a methoxy group, and a tert-butoxy group, or the like.

In Formula 2, a1 indicates the number of $R_{21}$s, and may be an integer from 0 to 8. When a1 is 2 or greater, a plurality of $R_{21}$s may be identical to or different from each other. For example, a1 in Formula 2 may be an integer from 0 to 2, or the like. In Formula 2, a2 indicates the number of $R_{22}$s, and may be an integer from 0 to 8. When a2 is 2 or greater, a plurality of $R_{22}$s may be identical to or different from each other. For example, a2 in Formula 2 may be an integer from 0 to 2. In Formula 2, n may be an integer from 1 to 3. For example, n in Formula 2 may be an integer of 2 or 3.

In Formula 2, L is selected from a monodentate organic ligand, a bidentate organic ligand, a tridentate organic ligand, and a tetradentate organic ligand. For example, L in Formula 2 may be a monodentate ligand selected from, for example, an iodide ion, a bromide ion, a chloride ion, a sulfide, a thiocyanate ion, a nitrate ion, an azide ion, a hydroxide ion, water, a nitrate ion, an isocyanate ion, an acetonitrile, a pyridine, an ammonia, a cyanide ion, carbon monoxide, or the like. In some embodiments, L in Formula 2 may be a bidentate organic ligand selected from, for example, an oxalate ion, an acetylacenonate, 1,2-bis(diphenylphosphino)ethane (dppe), 1,1-bis(diphenylphosphino)methane (dppm), glycinate, ethylenediamine, 2,2'-bipyridine, and 1,10-phenanthroline, or the like. In some other embodiments, L in Formula 2 may be may be a tridentate organic ligand selected from, for example, diethylenetriamine (dien), terpyridine, and triazacyclononane, or the like. In some other embodiments, L in Formula 2 may be a tetradentate organic ligand selected from, for example, heme, triethylenetetramine (trien), tris(2-aminoethyl)amine (tren), and tris(2-diphenylphosphinethyl)amine (np3), or the like. In some other embodiments, L in Formula 2 may be a ligand represented by one of Formulae 3-1 to 3-4, or the like:

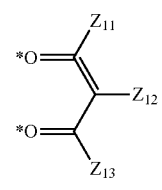

3-1

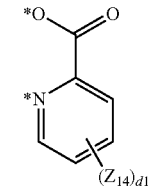

3-2

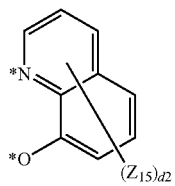

3-3

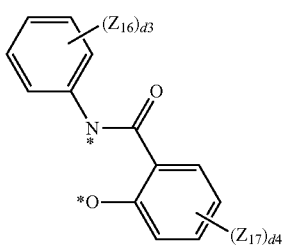

3-4

In Formulae 3-1 to 3-4, $Z_{11}$ to $Z_{17}$ may each independently be selected from i) a hydrogen atom, a deuterium atom, a halogen atom, a hydroxyl group, a cyano group, a nitro group, a $C_1$-$C_{60}$ alkyl group, and a $C_1$-$C_{60}$ alkoxy group; ii) a $C_1$-$C_{60}$ alkyl group, and a $C_1$-$C_{60}$ alkoxy group, each substituted with at least one of a deuterium atom, a halogen atom, a hydroxyl group, a cyano group, and a nitro group; iii) a $C_6$-$C_{60}$ aryl group and a $C_2$-$C_{60}$ heteroaryl group; and iv) a $C_1$-$C_{60}$ aryl group, and a $C_2$-$C_{60}$ heteroaryl group, each substituted with at least one of a deuterium atom, a halogen atom, a hydroxyl group, a cyano group, a nitro group a $C_1$-$C_{60}$ alkyl group, and a $C_1$-$C_{60}$ alkoxy group, and d1 to d4 may each independently be an integer from 1 to 4. In some other embodiments, L in Formula 2 may be a ligand represented by Formula 3-1, or the like:

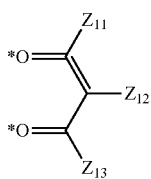

3-1

In Formula 3-1, Z11 to Z13 may each independently be selected from i) a hydrogen atom, a deuterium atom, a methyl group, an ethyl group, and a tert-butyl group; and ii) a methyl group, an ethyl group, and a tert-butyl group, each substituted with at least one of a deuterium atom, —F, a cyano group, and a nitro group.

In Formula 2, m indicates the number of Ls and may be an integer from 0 to 4. When m is 2 or greater, m number of Ls may be identical to or different from each other.

For example, m in Formula 2 may be an integer of 0 or 1. In some embodiments, the second light-emitting material represented by Formula 2 may be a material represented by one of Formulae 2a and 2b, or the like:

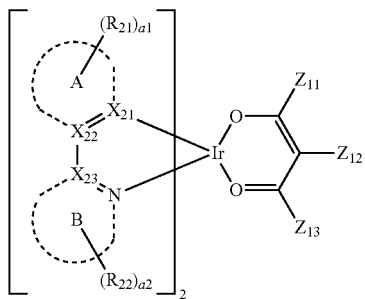

<Formula 2a>

<Formula 2b>

In Formulae 2a and 2b, rings A and B include respective ones of $X_{21}$ to $X_{24}$ and rings A and B may each independently be selected from cyclopentene, benzene, naphthalene, fluorene, pyridine, pyridazine, quinoline, isoquinoline, benzofuran, benzothiophene, thiazole, isothiazole, oxazole, isoxazole, benzothiazole, and benzoxazole. $R_{21}$ and $R_{22}$ may each independently be selected from i) a hydrogen atom, a deuterium atom —F, —Cl, a cyano group, a nitro group, —C(=O)$Q_1$ (where $Q_1$ is a methyl group or a phenyl group), a methyl group, a tert-butyl group, a methoxy group, and a tert-butoxy group; ii) a methyl group, an ethyl group, and a tert-butyl group, each substituted with at least one of a deuterium atom, —F, —Cl, a cyano group, and a nitro group; iii) a phenyl group; and iv) a phenyl group substituted with at least one of a deuterium atom, —F, —Cl, a cyano group, a nitro group, —C(=O)$Q_1$ (where $Q_1$ is a methyl group or a phenyl group), a methyl group, a tert-butyl group, a methoxy group, and a tert-butoxy group, a1 and a2 may each independently be an integer from 0 to 2, wherein two $R_{21}$s when a1 is an integer of 2 are identical to or different from each other, and two $R_{22}$s when a2 is an integer of 2 are identical to or different from each other. Z11 to Z13 may each independently be selected from i) a hydrogen atom, a deuterium atom, a methyl group, an ethyl group, and a tert-butyl group; and ii) a methyl group, an ethyl group, and a tert-butyl group, each substituted with at least one of a deuterium atom, —F, a cyano group, and a nitro group.

In some other embodiments, the second light-emitting material represented by Formula 2 may be one of Compounds 2-1 to 2-28, or the like:

2-1 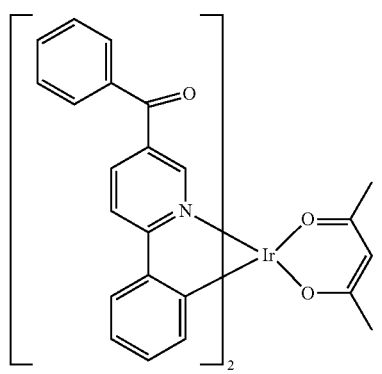
2-2 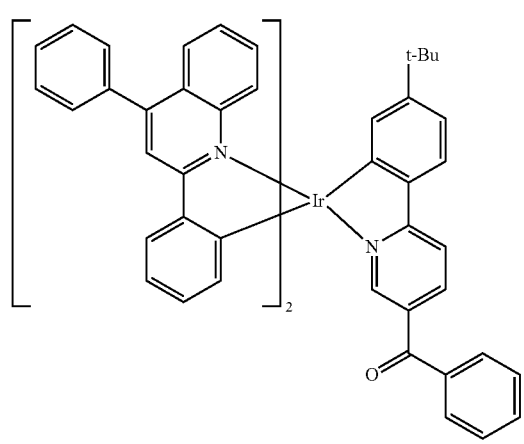
2-3
2-4 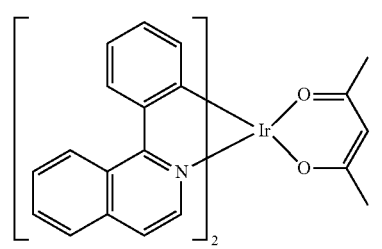
2-5 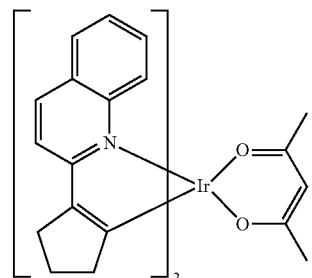
2-6 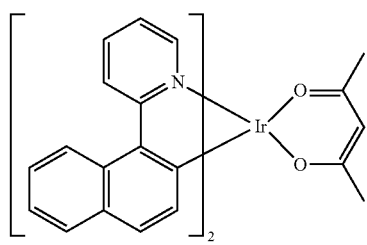
2-7 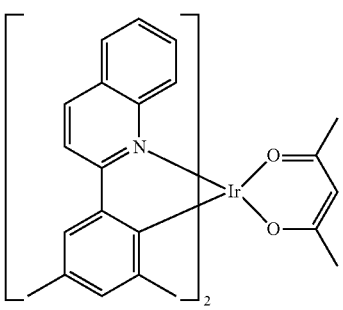
2-8 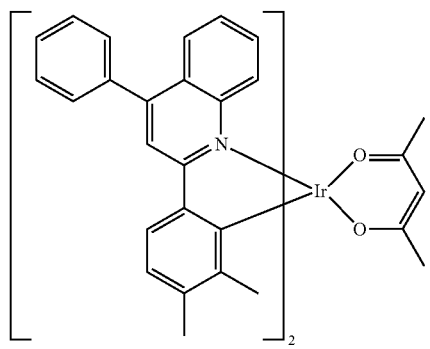
2-9 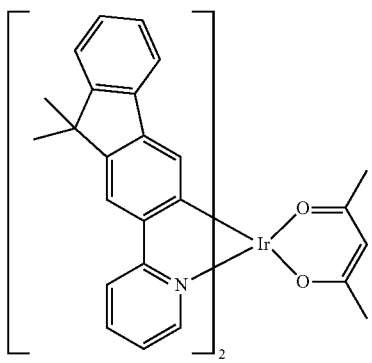

2-10
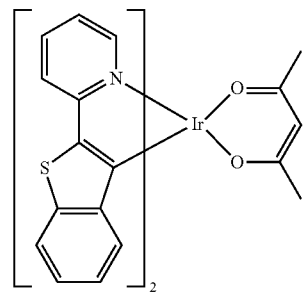
2-11
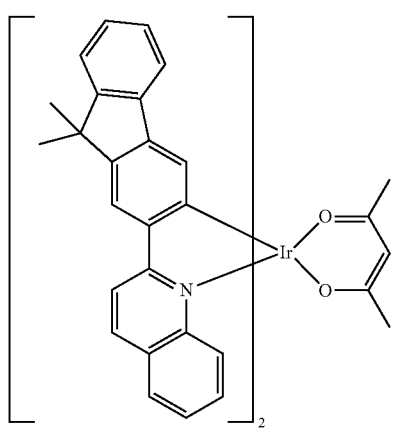
2-12
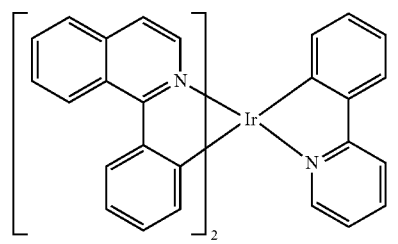
2-13
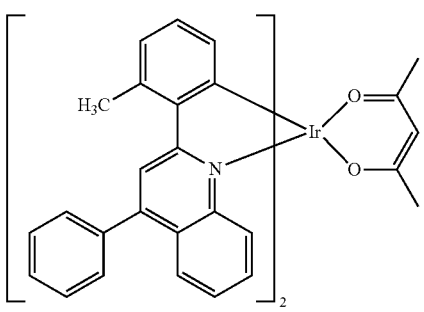
2-14
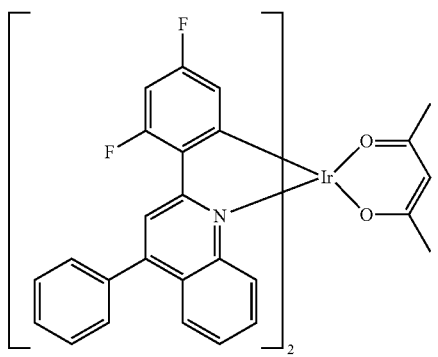
2-15
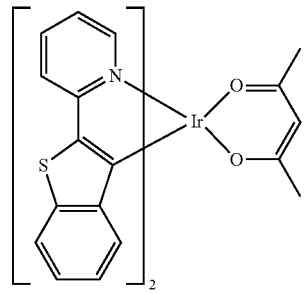
2-16
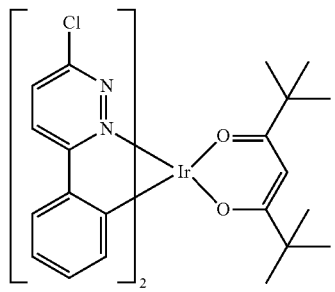
2-17
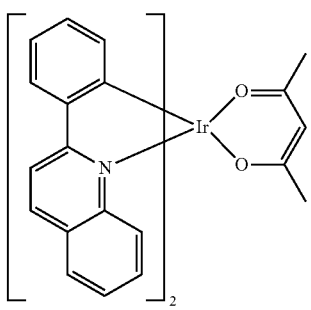
2-18
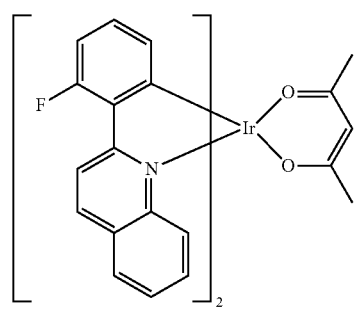
2-19
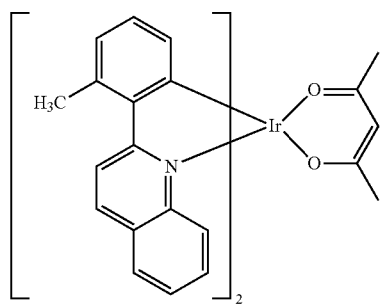

2-20 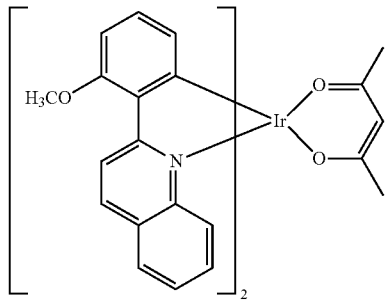

2-21 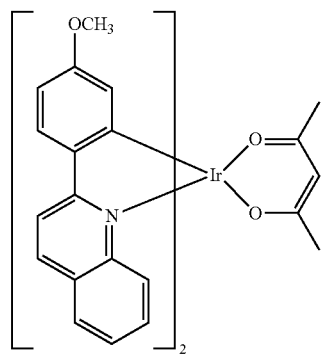

2-22 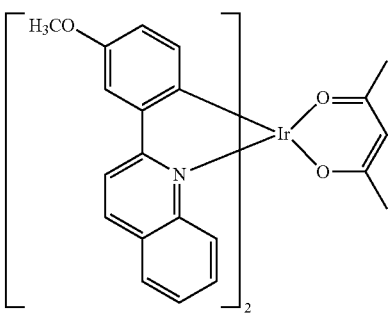

2-23 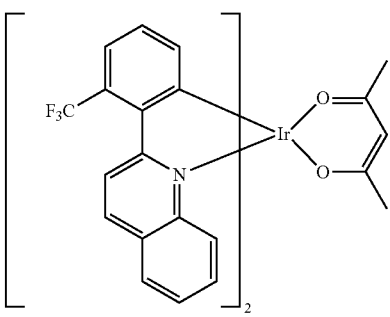

2-24 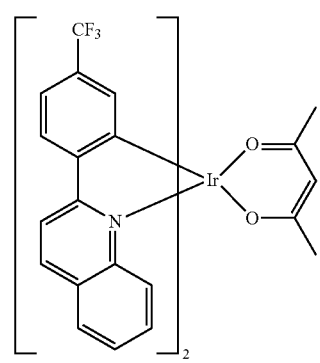

2-25 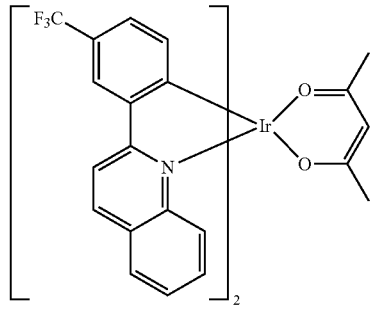

2-26 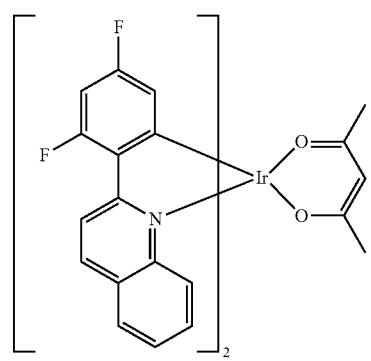

2-27 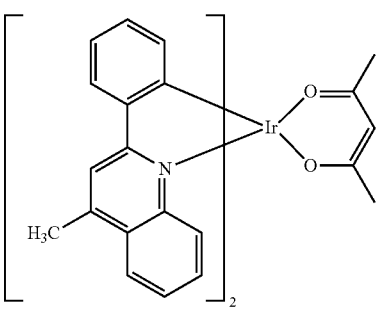

2-28 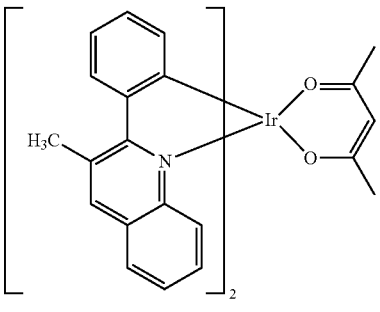

The EML may include at least one material selected from the first light-emitting materials represented by Formula 1 and at least one material selected from the second light-emitting materials of Formula 2a or 2b. For example, the EML may include at least one of Compounds 1-1 to 1-21, and at least one of Compounds 2-1 to 2-28.

The first light-emitting material may be controlled to have a triplet energy band gap of about 2.5 eV, thus may be used in a red organic light-emitting device. Furthermore, the first light-emitting material includes a long conjugate bond, and accordingly, may be a compound with high thermal stability and high electrical stability. An organic light-emitting device including the first light-emitting material represented by Formula 1 may have extended longevity. The second light-emitting material may be controlled to have a maximum emission wavelength of about 630 nm, and thus may be used in a red organic light-emitting material. Therefore, a red organic light-emitting device with high efficiency and long lifetime may be manufactured by using both the first light-emitting material represented by Formula 1 and the second light-emitting material represented by Formula 2.

When the organic light-emitting device is a full color organic light-emitting device, the emission layer may be patterned into a red emission layer, a green emission layer, and a blue emission layer. In some embodiments, the emission layer may include at least two of the red emission layer, the green emission layer and the blue emission layer that are stacked upon one another, and thus may emit white light. The red emission layer may include at least one material selected from the first light-emitting materials represented by Formula 1 and at least one material selected from the second light-emitting materials represented by Formula 2.

The organic light-emitting device may further include a suitable host. Examples of the suitable host are CBP (4,4'-N,N'-dicarbazole-biphenyl), PVK (poly(n-vinylcarbazole)), TCTA ((N-carbazolyl)-triphenylamine), TPBI (1,3,5-tris(N-phenylbenzimidazole-2-yl)benzene), UGH2 (1,4-bis(triphenylsilyl)benzene), mCP (9,9'-(1,3-phenylene)bis-9H-carbazole), OXD-7 (1,3-bis[2-(4-tert-butylphenyl)-1,3,4-oxadiazo-5-yl]benzene), and TAZ (3-(biphenyl-4-yl)-5-(4-tert-butylphenyl)-4-phenyl-4H-1,2,4-triazole).

The organic light-emitting device may further include a suitable dopant. The suitable dopant may be at least one phosphorescent dopant. For example, the phosphorescent dopant may be an organometallic complex including at least one selected from among iridium (Ir), platinum (Pt), osmium (Os), rhenium (Re), titanium (Ti), zirconium (Zr), hafnium (Hf), and a combination of at least two thereof.

Examples of the blue dopant are $F_2Irpic$, $(F_2ppy)_2Ir(tmd)$, and $Ir(dfppz)_3$.

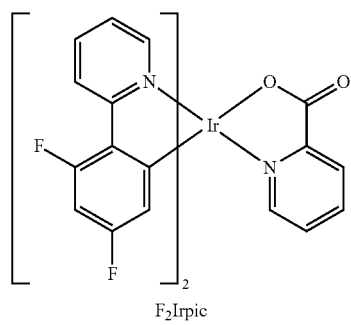

$F_2Irpic$

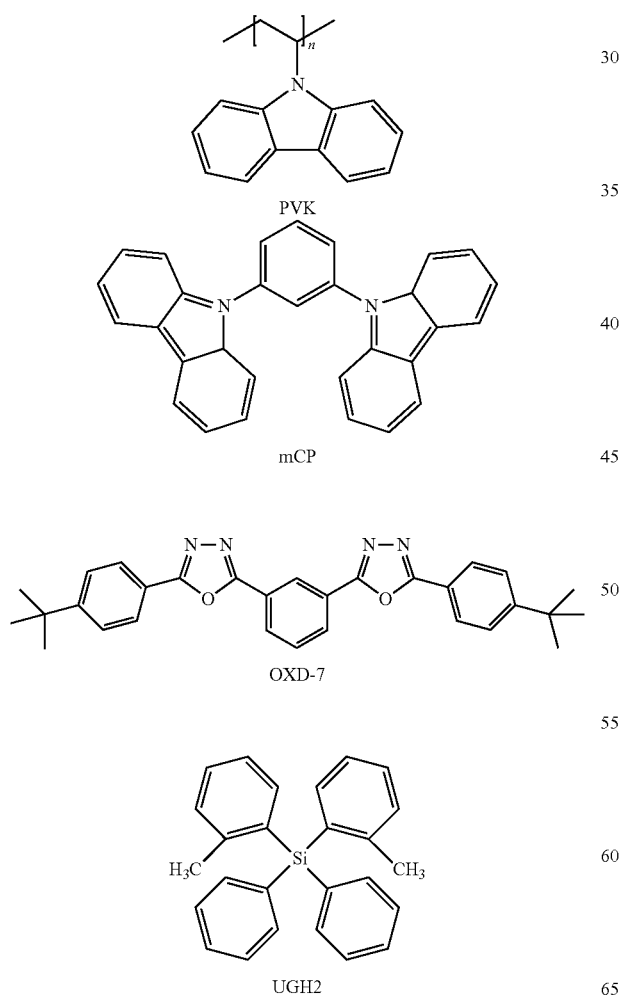

PVK mCP

OXD-7

UGH2

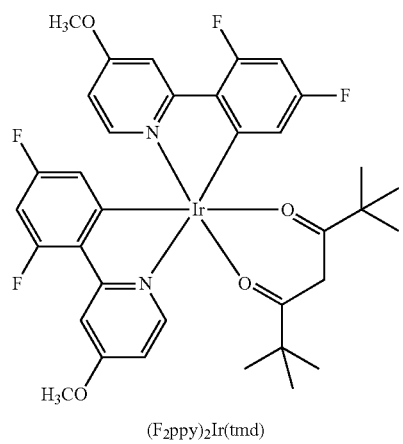

$(F_2ppy)_2Ir(tmd)$

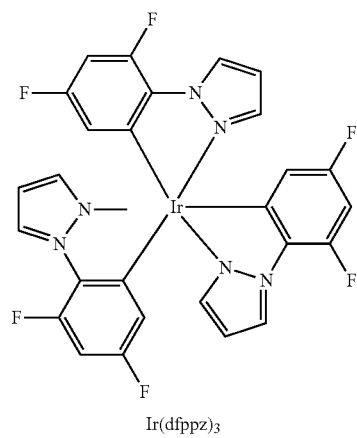

$Ir(dfppz)_3$

Examples of the red dopant are compounds represented by the following formulae.

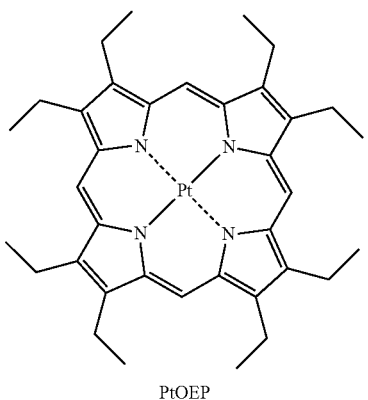

PtOEP

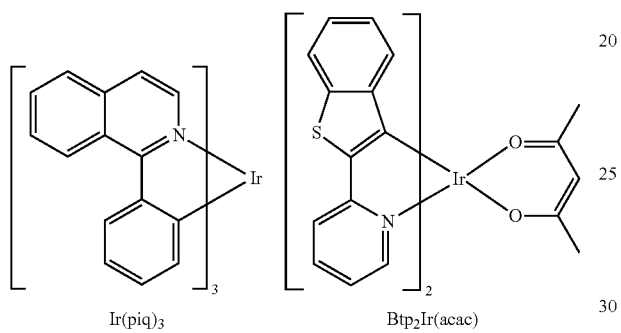

Ir(piq)₃   Btp₂Ir(acac)

Examples of the green dopant are compounds represented by the following formulae.

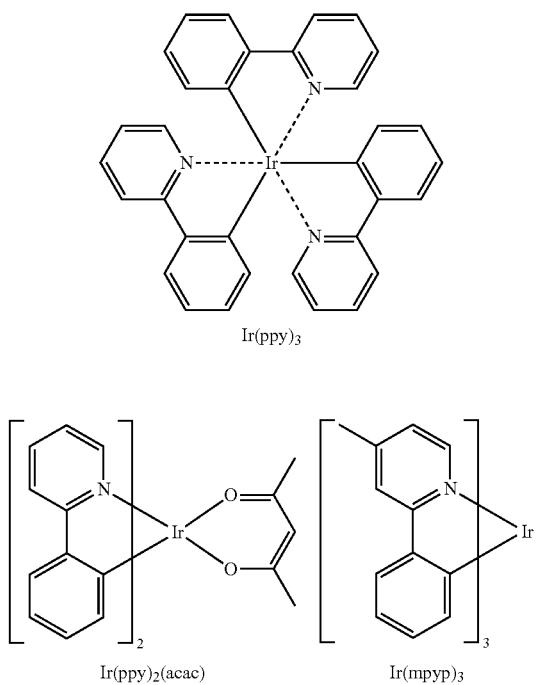

Ir(ppy)₃

Ir(ppy)₂(acac)   Ir(mpyp)₃

The thickness of the EML may be about 100 Å to about 1000 Å, and in some embodiments, may be from about 200 Å to about 600 Å. When the thickness of the EML is within these ranges, the EML may have good light emitting ability without a substantial increase in driving voltage.

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary depending on a compound that is used to form the ETL. A material for forming the ETL may be any suitable material that can stably transport electrons injected from an electron injecting electrode (cathode). Examples of a suitable electron transport material include quinoline derivatives, for example, tris(8-quinolinolate)aluminum (Alq3), TAZ (3-(biphenyl-4-yl)-5-(4-tert-butylphenyl)-4-phenyl-41H-1,2,4-triazole), Balq (beryllium bis(2-methyl-8-quinolinolato-N1,O8)-(1,1'-biphenyl)), Bebq2 (beryllium bis(benzoquinolin-10-olate), ADN, Compound 101, Compound 102, and Bphen(4,7-diphenyl-1,10-phenanthroline).

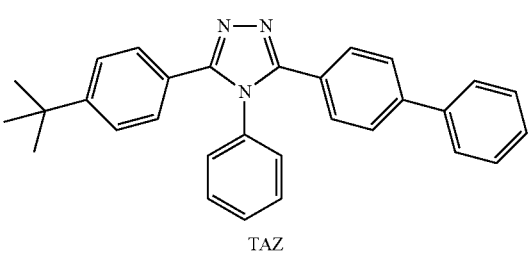

TAZ

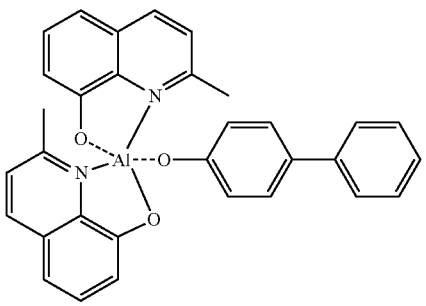

BAlq

<Compound 101>

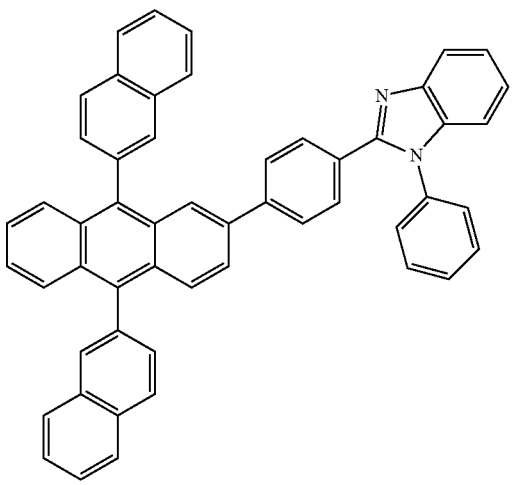

-continued

<Compound 102>

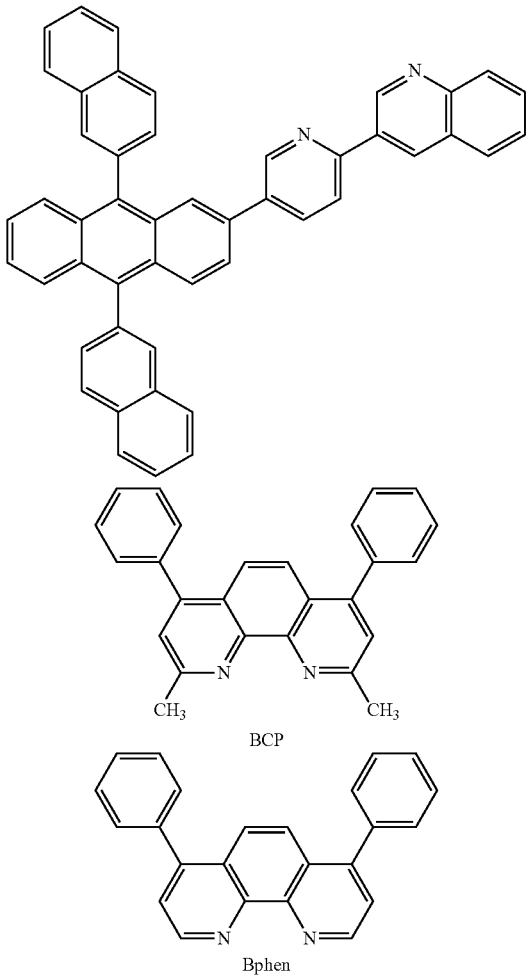

BCP

Bphen

The thickness of the ETL may be from about 100 Å to about 1,000 Å, and in some embodiments, may be from about 150 Å to about 500 Å. When the thickness of the ETL is within these ranges, the ETL may have satisfactory electron transporting ability without a substantial increase in driving voltage.

In some embodiments the ETL may further include a metal-containing material, in addition to any suitable electron-transporting organic compound. The metal-containing material may be a lithium (Li) complex. Examples of the Li complex include lithium quinolate (Liq) and Compound 203:

<Compound 203>

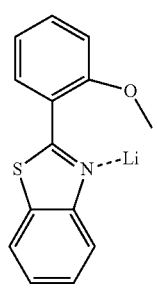

Then, an EIL, which facilitates injection of electrons from the cathode, may be formed on the ETL. Any suitable electron-injecting material may be used to form the EIL. Examples of materials for forming the EIL include LiF, NaCl, CsF, $Li_2O$, BaO, and the like. The deposition and coating conditions for forming the EIL 18 may be similar to those for the formation of the HIL, though the deposition and coating conditions may vary depending on the material that is used to form the EIL 18.

The thickness of the EIL may be from about 1 Å to about 100 Å, and in some embodiments, may be from about 3 Å to about 90 Å. When the thickness of the EIL is within these ranges, the EIL may have satisfactory electron injection ability without a substantial increase in driving voltage.

The second electrode 17 is disposed on the organic layer 15. The second electrode 17 may be a cathode that is an electron injection electrode. A material for forming the second electrode 17 may be a metal, an alloy, an electro-conductive compound, which have a low work function, or a mixture thereof. In this regard, the second electrode 9 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting device, the transmission electrode may be formed of indium tin oxide (ITO) or indium zinc oxide (IZO).

When a phosphorescent dopant is used in the EML, a HBL may be formed between the HTL and the EML or between the H-functional layer and the EML by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary depending on the material that is used to form the HBL. Any suitable hole-blocking material may be used. Examples of hole-blocking materials include oxadiazole derivatives, triazole derivatives, and phenanthroline derivatives. For example, bathocuproine (BCP) represented by the following formula may be used as a material for forming the HBL.

BCP

The thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

Although the organic light-emitting device of FIG. 1 is described above, the present invention is not limited thereto. As used herein, an unsubstituted $C_1$-$C_{60}$ alkyl group (or a $C_1$-$C_{60}$ alkyl group) may be a linear or branched $C_1$-$C_{60}$ alkyl group, for example, a methyl group, an ethyl group, a propyl group, an isobutyl group, a sec-butyl group, a pentyl group, an iso-amyl group, a hexyl group. A substituted $C_1$-$C_{60}$ alkyl group refers to a $C_1$-$C_{60}$ alkyl group of which at least one hydrogen is substituted with one of a deuterium atom, a halogen atom, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium atom, a halogen atom, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium atom, a halogen atom, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, dimethylfluorenyl group, a diphenyl group, a fluorenyl group, a carbazolyl group, a phenylcarbazolyl group, a pyridyl group, a pyrimidyl group, a pyrazinyl group, a pyridazinyl group, a triazinyl group, a quinolyl group, and an isoquinolyl group; and —N($Q_{11}$)($Q_{12}$); and —Si($Q_{13}$)($Q_{14}$)($Q_{15}$) (where $Q_{11}$ and $Q_{12}$ may be each independently a $C_6$-$C_{60}$ aryl group or a $C_2$-$C_{60}$ heteroaryl group, $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

As used herein, an unsubstituted $C_1$-$C_{60}$ alkoxy group (or a $C_1$-$C_{60}$ alkoxy group) may be a group represented by —OA, wherein A is an unsubstituted $C_1$-$C_{60}$ alkyl group described herein. Examples of the unsubstituted $C_1$-$C_{60}$ alkoxy group are a methoxy group, an ethoxy group, and an isopropyloxy group. At least one of the hydrogen atoms in the alkoxy group may be substituted with the substituents described herein in conjunction with the substituted $C_1$-$C_{60}$ alkyl group.

As used herein, an unsubstituted $C_2$-$C_{60}$ alkenyl group (or a $C_2$-$C_{60}$ alkenyl group) is a $C_2$-$C_{60}$ alkyl group having at least one carbon-carbon triple bond in the center or at a terminal thereof. Examples of the alkenyl group are an ethenyl group, a propenyl group, a butenyl group, and the like. At least one hydrogen atom in the unsubstituted $C_2$-$C_{60}$ alkenyl group may be substituted with those substituents described herein in conjunction with the substituted $C_1$-$C_{60}$ alkyl group.

As used herein, an unsubstituted $C_2$-$C_{60}$ alkynyl group (or a $C_2$-$C_{60}$ alkynyl group) is a $C_2$-$C_{60}$ alkyl group having at least one carbon-carbon triple bond in the center or at a terminal thereof. Examples of the unsubstituted $C_2$-$C_{60}$ alkynyl group (or a $C_2$-$C_{60}$ alkynyl group) are an ethenyl group, a propynyl group, and the like. At least one hydrogen atom in the alkynyl group may be substituted with those substituents described herein in conjunction with the substituted $C_1$-$C_{60}$ alkyl group.

As used herein, an unsubstituted $C_3$-$C_{60}$ cycloalkyl group indicates a cyclic, monovalent $C_3$-$C_{60}$ saturated hydrocarbon group. Examples of the unsubstituted $C_3$-$C_{30}$ cycloalkyl group include a cyclopropyl group, a cyclobutyl group, a cyclopentyl group, a cyclohexyl group, and a cyclooctyl group. At least one hydrogen atom in the cycloalkyl group may be substituted with those substituents described herein in conjunction with the substituted $C_1$-$C_{60}$ alkyl group.

As used herein, an unsubstituted $C_3$-$C_{30}$ cycloalkenyl group indicates a nonaromatic, cyclic unsaturated hydrocarbon group with at least one carbon-carbon double bond. Examples of the unsubstituted $C_3$-$C_{60}$ cycloalkenyl group are a cyclopropenyl group, a cyclobutenyl group, a cyclopentenyl group, a cyclohexcenyl group, a cycloheptenyl group, a 1,3-cyclohexadienyl group, a 1,4-cyclohexadienyl group, a 2,4-cycloheptadienyl group, and a 1,5-cyclooctadienyl group. At least one hydrogen atom in the cycloalkenyl group may be substituted with those substituents described herein in conjunction with the substituted $C_1$-$C_{60}$ alkyl group.

As used herein, an unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ aryl group is a divalent group having a carbocyclic aromatic system having 6 to 60 carbon atoms including at least one aromatic ring. When the aryl group or the aryl group has at least two rings, they may be fused to each other via a single bond. At least one hydrogen atom in the aryl group and the aryl group may be substituted with those substituents described herein in conjunction with the $C_1$-$C_{60}$ alkyl group.

Examples of the substituted or unsubstituted $C_6$-$C_{60}$ aryl group are a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- or p-fluorophenyl group and a dichlorophenyl group), a dicyanophenyl group, a trifluoromethoxyphenyl group, an o-, m- or p-tolyl group, an o-, m- or p-cumenyl group, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, hexacenyl group, a rubicenyl group, a coronenyl group, a trinaphthylenyl group, a heptaphenyl group, a heptacenyl group, a pyranthrenyl group, an ovalenyl group, and a spiro-fluorenyl group. Examples of the substituted $C_6$-$C_{60}$ aryl group may be inferred based on those of the unsubstituted $C_6$-$C_{60}$ aryl group and the substituted $C_1$-$C_{30}$ alkyl group described above. Examples of the substituted or unsubstituted $C_6$-$C_{60}$ arylene group may be inferred based on those examples of the substituted or unsubstituted $C_6$-$C_{60}$ aryl group described above.

As used herein, an unsubstituted $C_2$-$C_{60}$ heteroaryl group is a monovalent carbocyclic aromatic system having at least one aromatic ring and at least one of the heteroatoms selected from N, O, P, and S as a ring-forming atom. The unsubstituted $C_2$-$C_{60}$ heteroaryl group is a divalent carbocyclic aromatic system having at least one aromatic ring and at least one of the heteroatoms selected from the group of N, O, P, and S. In this regard, when the heteroaryl group and the heteroaryl group have at least two rings, they may be fused to each other via a single bond. At least one hydrogen atom in the heteroaryl group and the heteroaryl group may be substituted with those substituents described with reference to the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the substituted or unsubstituted $C_2$-$C_{60}$ heteroaryl group may be based on those examples of the substituted or unsubstituted $C_2$-$C_{60}$ aryl group as described herein.

As used herein, a substituted or unsubstituted $C_6$-$C_{60}$ aryloxy group indicates —OA2 (where A2 is a substituted or unsubstituted $C_6$-$C_{60}$ aryl group described herein). The substituted or unsubstituted $C_6$-$C_{60}$ arylthiol group indicates —SA3 (where A3 is a substituted or unsubstituted $C_6$-$C_{60}$ aryl group described herein).

Hereinafter, the present disclosure will be described in detail with reference to the following synthesis examples and other examples. However, these examples are for illustrative purposes only and are not intended to limit the scope of the present disclosure. The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

An ITO/Ag/ITO substrate as an anode was sonicated in isopropyl alcohol and pure water each for about 5 minutes, and then cleaned by irradiation of ultraviolet rays for about 10 minutes and exposure to ozone. The resulting substrate was loaded into a vacuum deposition device. Compound 301 was deposited on the ITO layer (anode) of the substrate to form an HIL having a thickness of 600 Å, and then 4,4'-bis[N-(1-naphthyl)-N-phenylamino]biphenyl (NPS) was deposited on the HIL to form a HTL having a thickness of 600 Å. Compound A was deposited on the HTL to form a buffer layer having a thickness of about 550 Å. Compound 1-12 (host) and Compound 2-7 (red dopant) were co-deposited on the buffer layer in a weight ratio of about 400:3 to form an EML having a thickness of about 400 Å. Then, Compound 101 was deposited on the EML to form an ETL having a thickness of about 300 Å, and then LiQ was deposited on the ETL to form an EIL having a thickness of about 10 Å. Then, Mg and Ag were co-deposited on the EIL under vacuum in a weight ratio of 130:1 to form a cathode having a thickness of about 130 Å, thereby completing the manufacture of an organic light-emitting device.

<Compound 301>

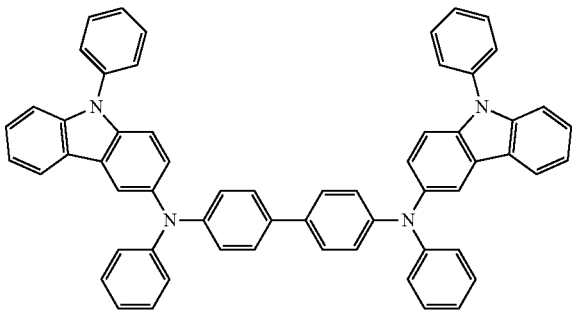

<Compound A>

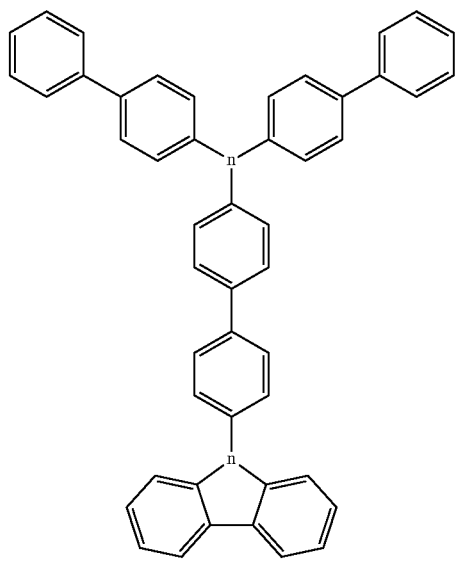

<Compound 101>

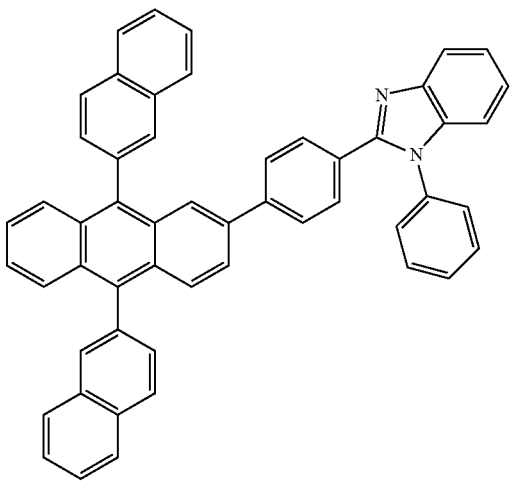

Comparative Example 1

An organic light-emitting device was manufactured in the same manner as in Example, except that Compound H1 (host), instead of Compound 1-12, was used to form the EML.

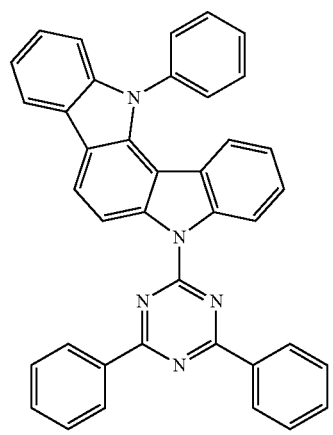

<Compound H1>

Comparative Example 2

An organic light-emitting device was manufactured in the same manner as in the Example, except that Compound H2 (host), instead of Compound 1-12, was used to form the EML.

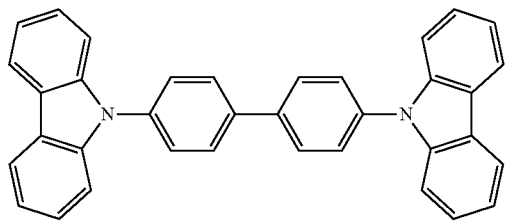

<Compound H2>

Comparative Example 3

An organic light-emitting device was manufactured in the same manner as in the Example, except that Compound D1 (green dopant), instead of Compound 2-7, was used to form the EML.

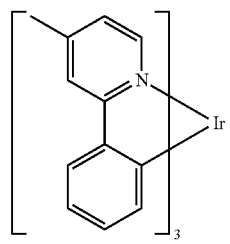

<Compound D1>

Comparative Example 4

An organic light-emitting device was manufactured in the same manner as in Example, except that Compound H1 (host) and Compound D1 (green dopant), instead of Compound 1-12 and Compound 2-7, respectively, were used to form the EML.

Comparative Example 5

An organic light-emitting device was manufactured in the same manner as in Example, except that Compound H2 (host), instead of Compound 1-12, was used to form the EML.

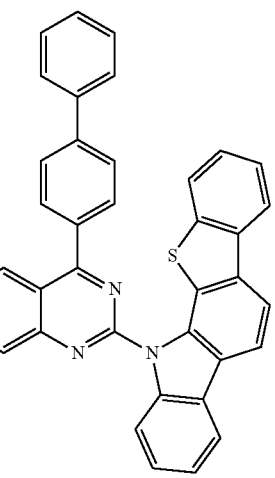

<Compound H2>

Evaluation Example 1

Driving voltages, current densities, luminance, efficiencies, and color purities of the organic light-emitting devices of Example and Comparative Examples 1 to 5 were measured using a Keithley SMU 236 and a PR650 (Spectroscan) Source Measurement Unit (available from Photo Research, Inc.). The results are shown in Table 1.

TABLE 1

| Example | Driving voltage (V) | Current density (mA/cm$^2$) | Luminance (Cd/m$^2$) | Efficiency (Cd/A) | CIE color coordinate x | CIE color coordinate y | Emission color |
|---|---|---|---|---|---|---|---|
| Example | 5.3 | 11.2 | 3700 | 33 | 0.668 | 0.332 | Red |
| Comparative Example 1 | 4.4 | 15.1 | 3700 | 25 | 0.646 | 0.352 | Red |
| Comparative Example 2 | 6 | 20.4 | 3700 | 18.1 | 0.648 | 0.35 | Red |
| Comparative Example 3 | 5.5 | 29.9 | 3700 | 30.2 | 0.259 | 0.707 | Green |
| Comparative Example 4 | 4.5 | 9.8 | 3700 | 80 | 0.326 | 0.653 | Green |
| Comparative Example 5 | 5.2 | 14.8 | 3700 | 31 | 0.661 | 0.336 | Red |

Referring to Table 1, the organic light-emitting device of Example 1 was found to have higher efficiencies than the phosphorescent red organic light-emitting devices of Comparative Examples 1 and 2. Compared to Comparative Example 3, the organic light-emitting device using the compound represented by Formula 1 as a green phosphorescent host had a lower efficiency than the organic light-emitting device of Comparative Example 3. That is, the organic light-emitting device using the compound represented by Formula 1 emits red light and has high efficiency.

Referring to FIG. 1, the organic light-emitting device of Example took about 60 hours or longer until an initial luminance was reduced to about 97% or less thereof, while the organic light-emitting device of Comparative Example 5 took about 35 hours until an initial luminance was reduced to about 97% or less thereof. This indicates that the organic light-emitting device of Example has a significantly longer lifetime than the organic light-emitting device of Comparative Example 5.

By way of summation, according to the one or more of the embodiments, an organic light-emitting device including at least one first light-emitting material of Formula 1 and at least one second light-emitting material of Formula 2 may have improved efficiency and improved lifetime. One or more embodiments include an organic light-emitting device (OLED) with high efficiency and improved lifetime.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic light-emitting device, comprising:
a first electrode;
a second electrode disposed opposite to the first electrode; and
an organic layer disposed between the first electrode and the second electrode, wherein, the organic layer includes an emission layer and a hole transport region, the hole transport region being disposed between the first electrode and the emission layer, the emission layer includes a condensed cyclic compound represented by Formula 101, and the hole transport region includes an amine-based compound represented by Formula 201,

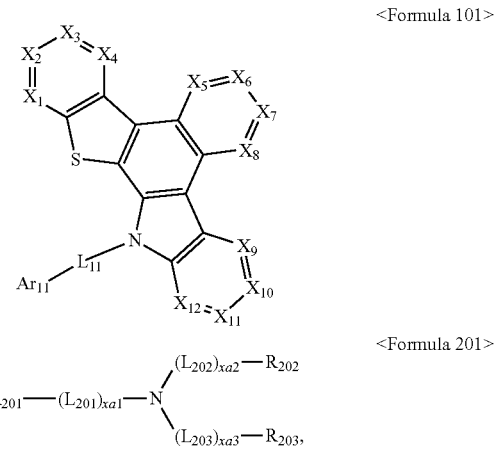

wherein, in Formulae 101 and 201, $X_1$ is $CR_1$ or N; $X_2$ is $CR_2$ or N; $X_3$ is $CR_3$ or N; $X_4$ is $CR_4$ or N; $X_5$ is $CR_5$ or N; $X_6$ is $CR_6$ or N; $X_7$ is $CR_7$ or N; $X_8$ is $CR_8$ or N; $X_9$ is $CR_9$ or N; $X_{10}$ is $CR_{10}$ or N; $X_{11}$ is $CR_{11}$ or N; $X_{12}$ is $CR_{12}$ or N, $L_{11}$ is a group represented by any one of Formulae 301 to 304,

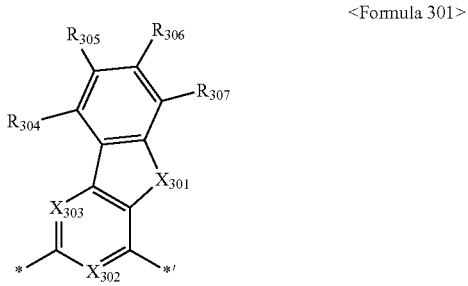

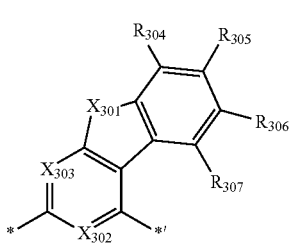

<Formula 302>

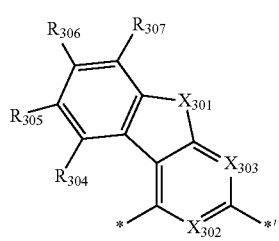

<Formula 303>

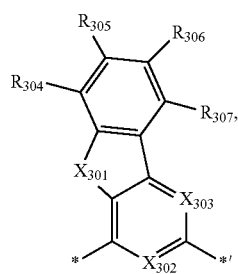

<Formula 304> wherein, in Formulae 301 to 304, $X_{301}$ is selected from O, S, and Se, $X_{302}$ is $CR_{302}$ or N, $X_{303}$ is $CR_{303}$ or N, $R_{302}$ to $R_{307}$ and $R_1$ to $R_{12}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group,

* and *' each independently indicate a binding site to a neighboring atom, $L_{201}$ to $L_{203}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa3 are each independently an integer selected from 0 to 3, and $Ar_1$ and $R_{201}$ to $R_{203}$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

2. The organic light-emitting device as claimed in claim 1, wherein $X_1$ is $CR_1$; $X_2$ is $CR_2$; $X_3$ is $CR_3$; $X_4$ is $CR_4$; $X_5$ is $CR_5$; $X_6$ is $CR_6$; $X_7$ is $CR_7$; $X_8$ is $CR_8$; $X_9$ is $CR_9$; $X_{10}$ is $CR_{10}$; $X_{11}$ is $CR_{11}$; and $X_{12}$ is $CR_{12}$.

3. The organic light-emitting device as claimed in claim 1, wherein $X_{301}$ is selected from O and S.

4. The organic light-emitting device as claimed in claim 1, wherein $X_{302}$ is N, and $X_{303}$ is N.

5. The organic light-emitting device as claimed in claim 1, wherein $R_{302}$ to $R_{307}$ and $R_1$ to $R_{12}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

6. The organic light-emitting device as claimed in claim 1, wherein $L_{201}$ to $L_{203}$ are each independently selected from:
a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a C1-C20 alkyl group, a C1-C20 alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a C1-C10 alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group.

7. The organic light-emitting device as claimed in claim 1, wherein $Ar_{11}$ and $R_{201}$ to $R_{203}$ are each independently selected from:

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein Q31 to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group.

8. The organic light-emitting device as claimed in claim 1, wherein the condensed cyclic compound represented by Formula 101 is a condensed cyclic compound represented by Formula 102:

<Formula 102>

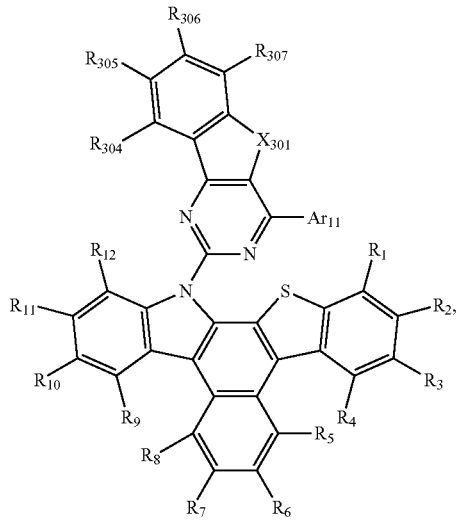

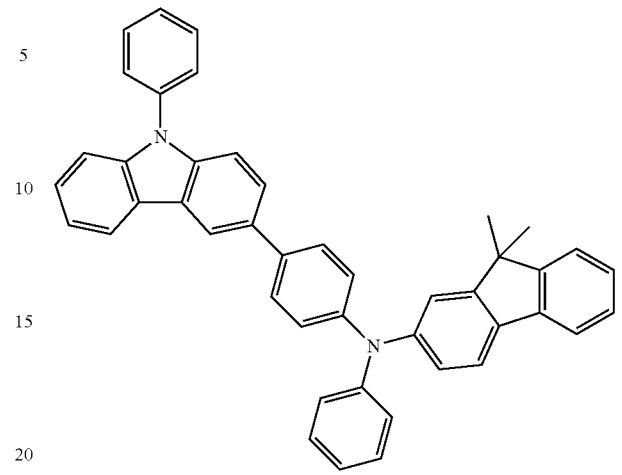

wherein, in Formula 102,

Ar$_{11}$ and R$_1$ to R$_{12}$ are the same as described in connection with Formula 1, and X$_{301}$ and R$_{304}$ to R$_{307}$ are the same as described in connection with Formulae 301 to 304.

9. The organic light-emitting device as claimed in claim 1, wherein the condensed cyclic compound represented by Formula 101 is Compound 1001:

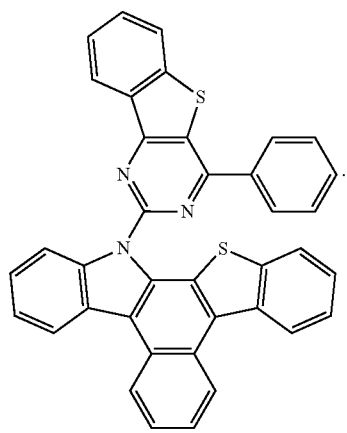

1001

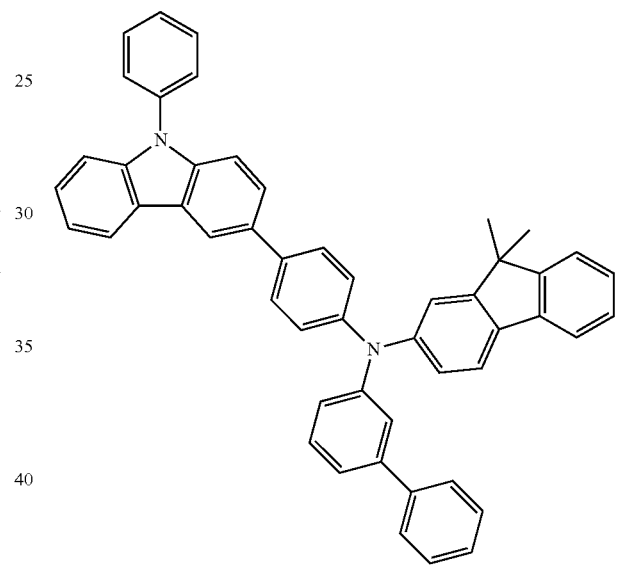

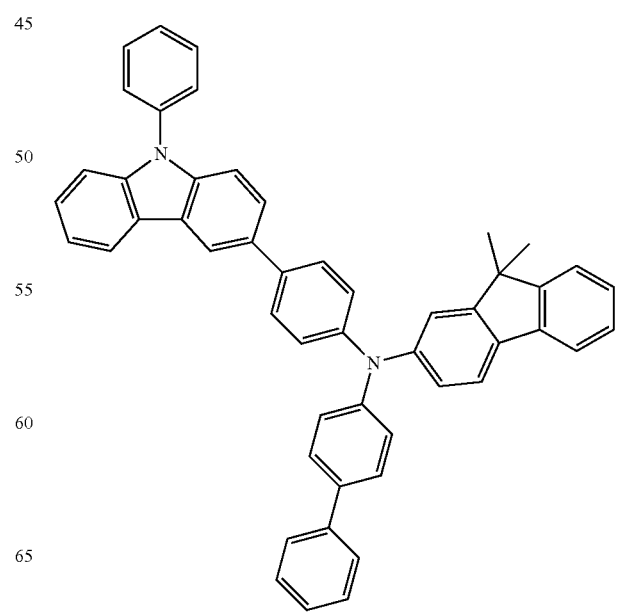

10. The organic light-emitting device as claimed in claim 1, wherein the amine-based compound represented by Formula 201 is selected from Compounds HT1 to HT15:

85
-continued
HT4
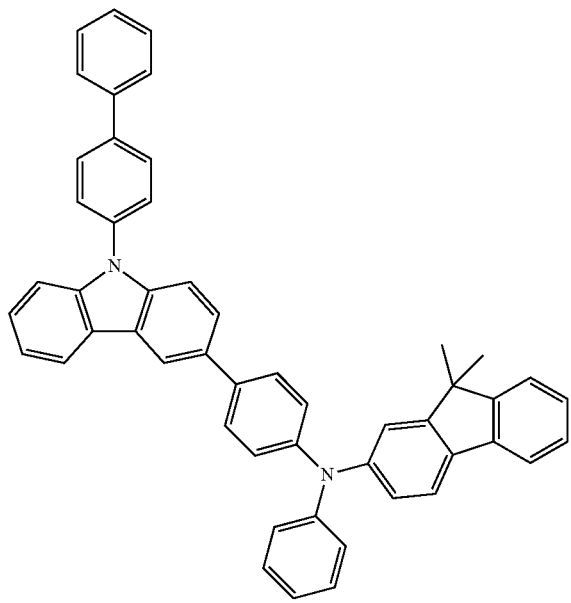
86
-continued
HT6
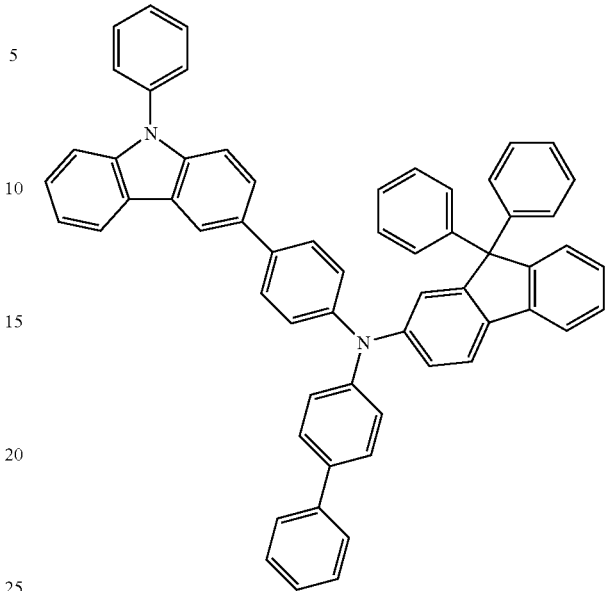
HT5
HT7
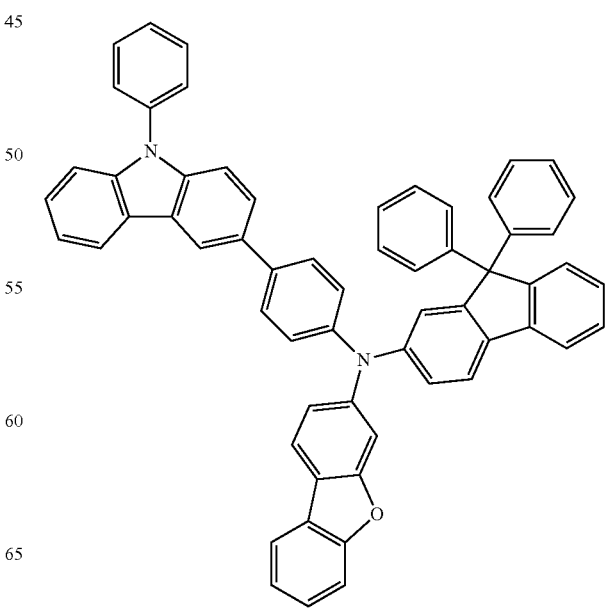

HT8
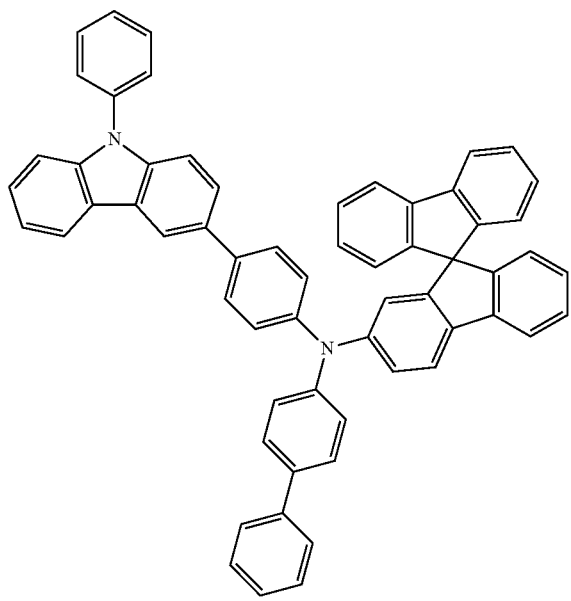
HT9
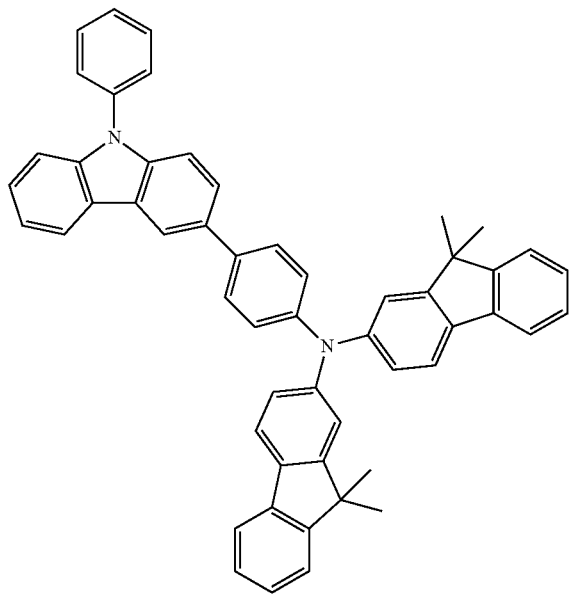
HT10
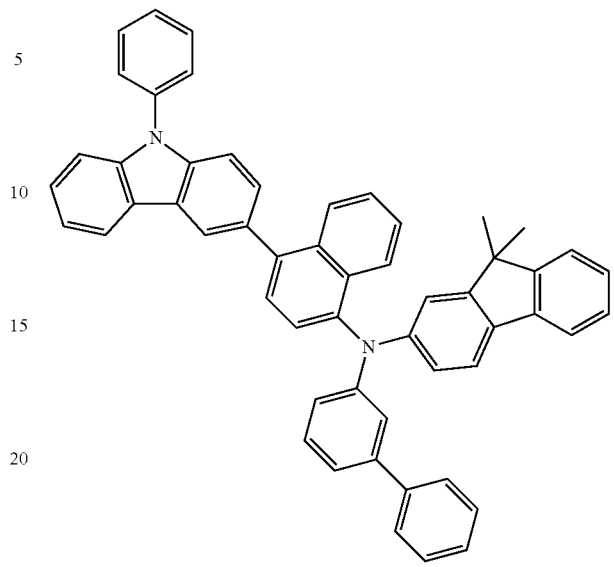
HT11
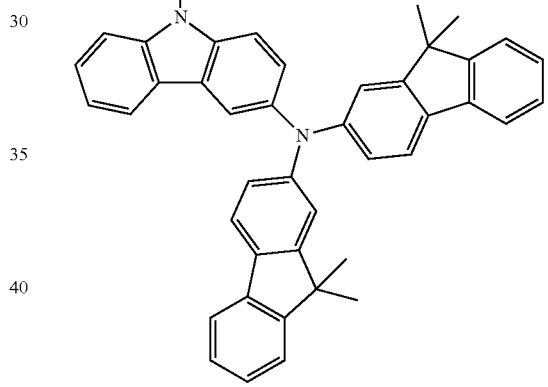
HT12
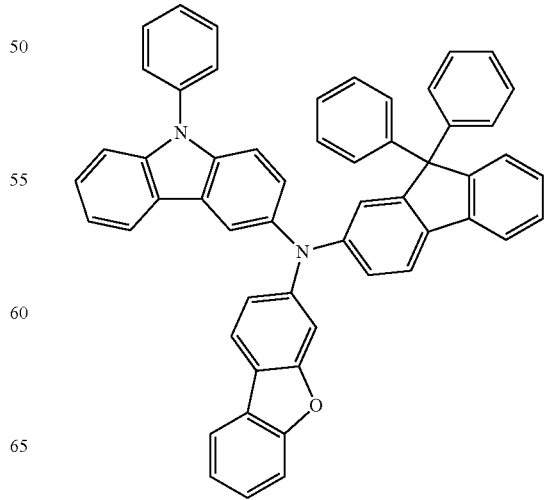

HT13

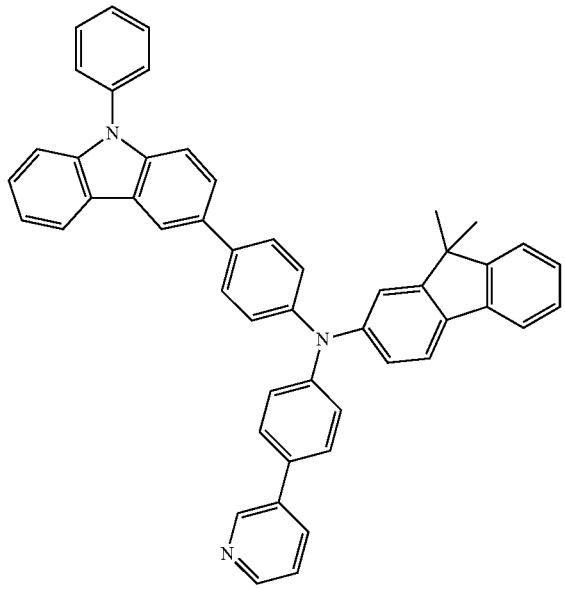

HT14

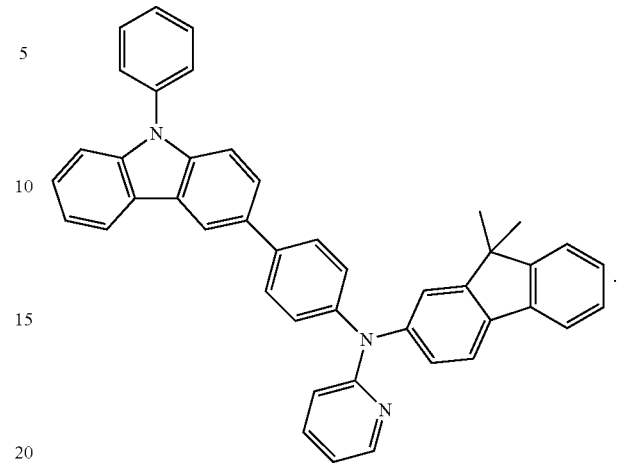

HT15

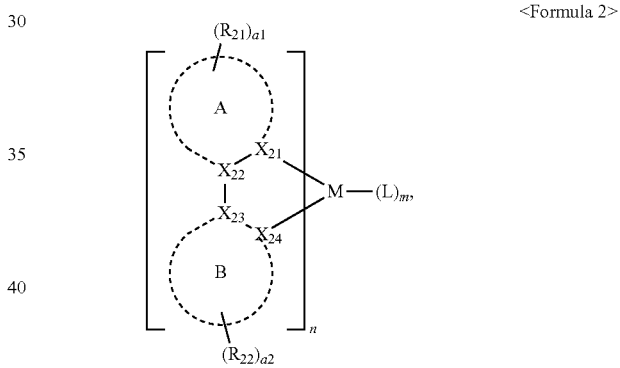

11. The organic light-emitting device as claimed in claim 1, wherein the emission layer emits red light.

12. The organic light-emitting device as claimed in claim 1, wherein the emission layer further includes an organometallic compound represented by Formula 2:

$$\left[\begin{array}{c}(R_{21})_{a1}\\ \underset{\substack{X_{22}\\ X_{23}}}{\overset{A}{\underset{X_{24}}{\overset{X_{21}}{\diagdown}}}}M-(L)_{m'}\\ (R_{22})_{a2}\end{array}\right]_n$$

<Formula 2> wherein, in Formula 2,

M is a transition metal having an atomic weight of 40 or greater, $X_{21}$ to $X_{24}$ are each independently a carbon atom or a nitrogen atom, $X_{21}$ and $X_{22}$ are linked via a single bond or a double bond, $X_{23}$ and $X_{24}$ are linked via a single bond or a double bond, rings A and B are each independently selected from a $C_4$-$C_{20}$ cycloalkyl group, a $C_2$-$C_{20}$ heterocycloalkyl group, a $C_6$-$C_{20}$ aryl group, and a $C_2$-$C_{20}$ heteroaryl group;

$R_1$ to $R_{12}$, $R_{21}$, and $R_{22}$ are each independently selected from a hydrogen atom, deuterium atom, —F, —Cl, —Br, —I, a hydroxyl group, a cyano group, a nitro group, an amino group, an amidino group, a hydrazino group, a hydrazono group, —C(=O)$Q_1$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_2$-$C_{60}$ heterocycloalkyl group, a substituted or unsubstituted $C_3$-$C_{60}$ cycloalkenyl group, a substituted or unsubstituted $C_2$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group,

- a1 and a2 are each independently an integer from 0 to 8, wherein, when a1 is two or greater, the number a1 of $R_{21}$s are identical to or different from each other, and when a2 is an integer of 2 or greater, the number a2 of $R_{22}$s are identical to or different from each other; n is an integer from 1 to 3,
- L is selected from a monodentate organic ligand, a bidentate organic ligand, a tridentate organic ligand, and a tetradentate organic ligand,
- m is an integer from 0 to 4, and
- $Q_1$ is selected from a $C_1$-$C_{10}$alkyl group, a $C_6$-$C_{10}$ aryl group, and a $C_6$-$C_{60}$ aryloxy group.

13. The organic light-emitting device as claimed in claim 1, wherein the emission layer further includes an organometallic compound selected from Compounds 2-1 to 2-14 and 2-16 to 2-29:

2-1
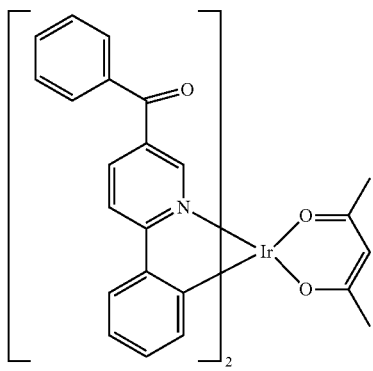

2-2
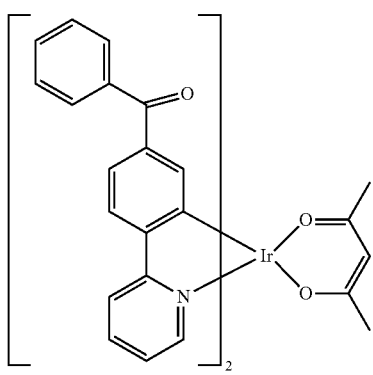

2-3
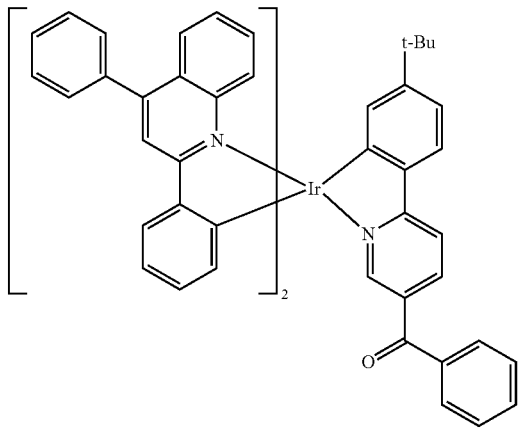

2-4
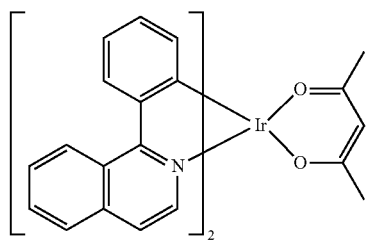

2-5
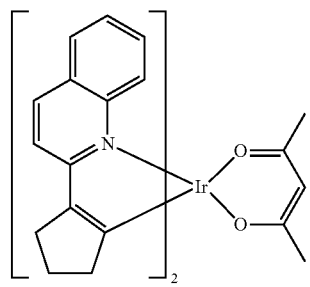

2-6
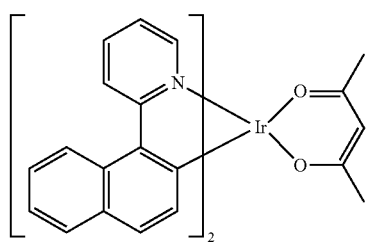

2-7
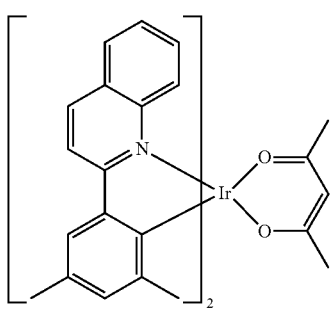

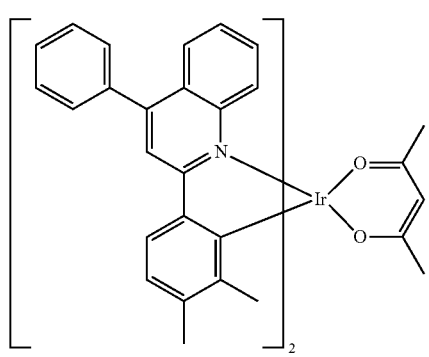
2-8
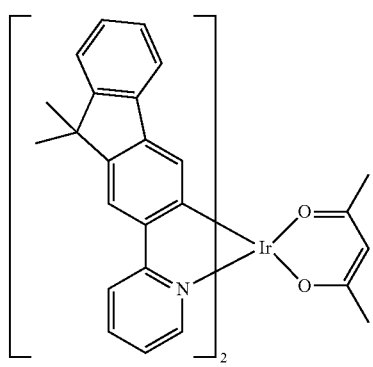
2-9
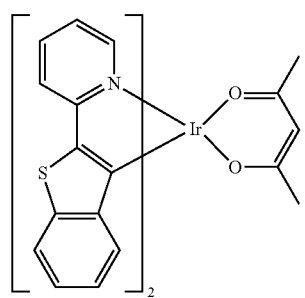
2-10
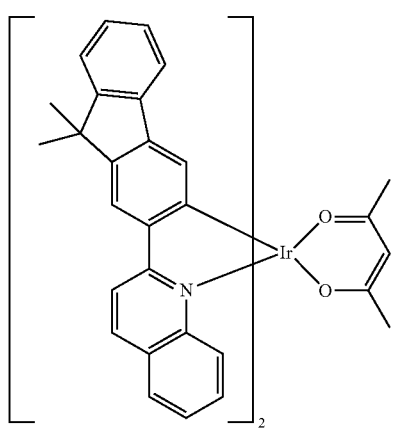
2-11
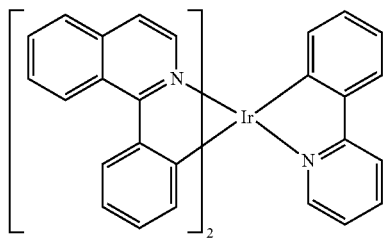
2-12
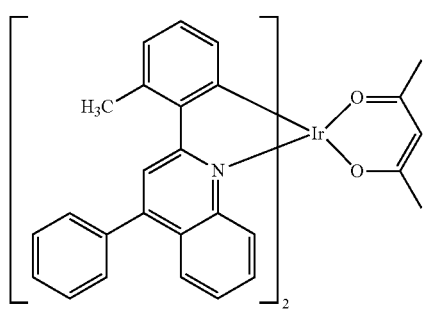
2-13
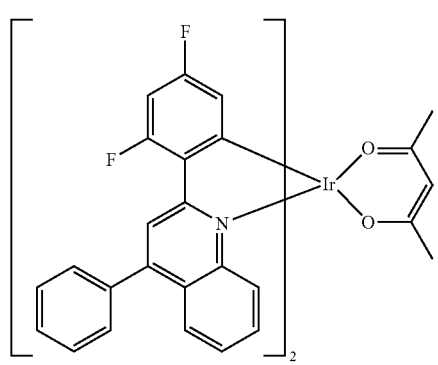
2-14
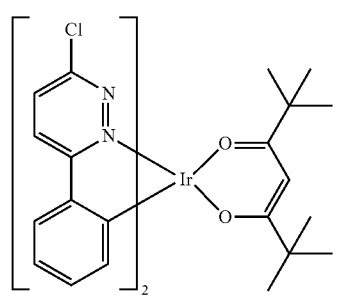
2-16
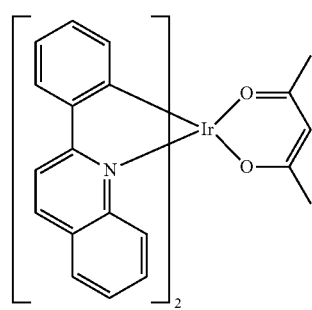
2-17

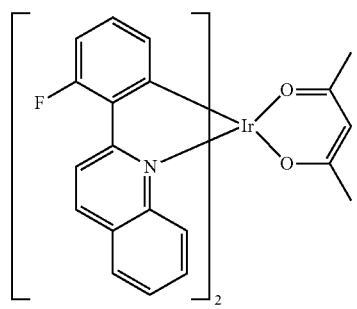
2-18
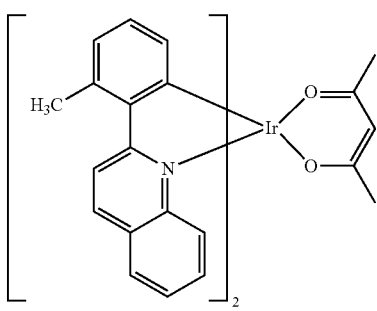
2-19
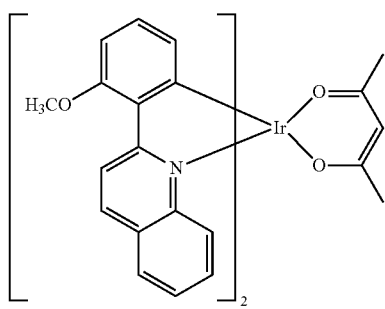
2-20
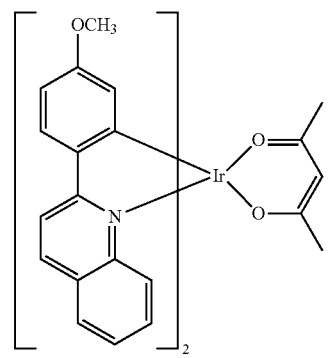
2-21
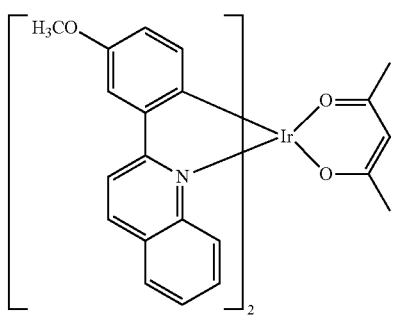
2-22
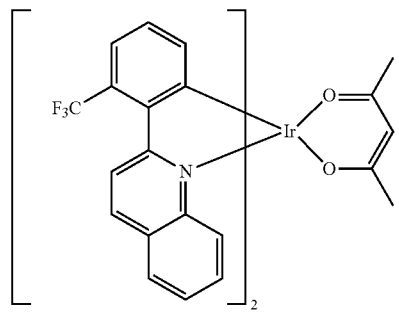
2-23
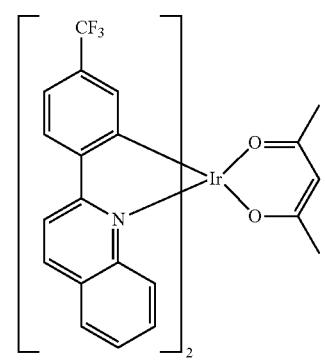
2-24
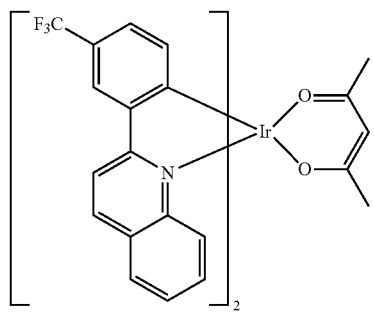
2-25
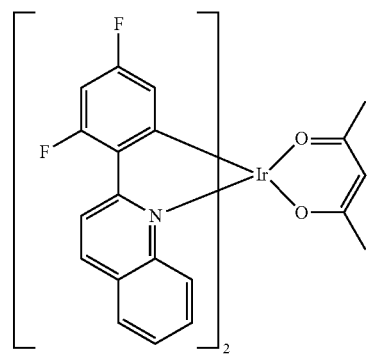
2-26
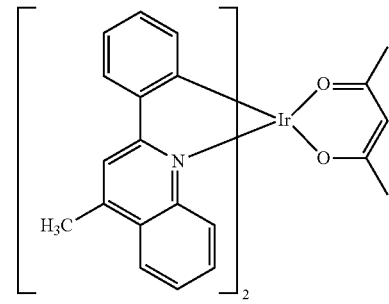
2-27

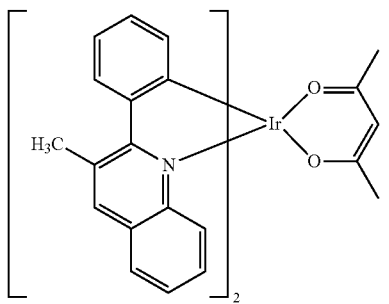
2-28
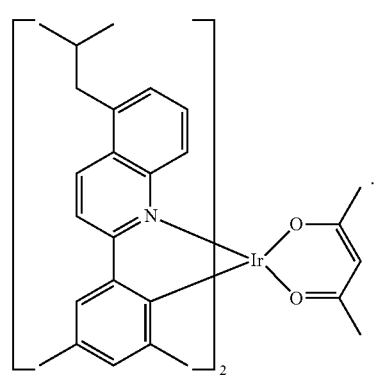
2-29
* * * * *